United States Patent
Takizawa

(10) Patent No.: US 8,587,306 B2
(45) Date of Patent: Nov. 19, 2013

(54) MAGNETIC RESONANCE IMAGING APPARATUS AND MULTI-CONTRAST ACQUIRING METHOD

(75) Inventor: Masahiro Takizawa, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 514 days.

(21) Appl. No.: 12/812,552

(22) PCT Filed: Jan. 15, 2009

(86) PCT No.: PCT/JP2009/050470
§ 371 (c)(1),
(2), (4) Date: Jul. 12, 2010

(87) PCT Pub. No.: WO2009/093517
PCT Pub. Date: Jul. 30, 2009

(65) Prior Publication Data
US 2010/0296717 A1 Nov. 25, 2010

(30) Foreign Application Priority Data
Jan. 23, 2008 (JP) .................................. 2008-012079

(51) Int. Cl.
*G01V 3/00* (2006.01)
(52) U.S. Cl.
USPC .......................................................... 324/309

(58) Field of Classification Search
USPC ................................................. 324/300–322
See application file for complete search history.

(56) References Cited

U.S. PATENT DOCUMENTS

| 7,372,269 B2 * | 5/2008 | Takizawa et al. | 324/309 |
| 7,786,728 B2 * | 8/2010 | Fukuta | 324/307 |
| 7,840,049 B2 * | 11/2010 | Stemmer | 382/131 |
| 7,847,546 B2 * | 12/2010 | Takizawa et al. | 324/307 |
| 8,183,865 B2 * | 5/2012 | Stemmer | 324/309 |

FOREIGN PATENT DOCUMENTS

| JP | 10-234708 | 9/1998 |
| JP | 2000-325325 | 11/2000 |

OTHER PUBLICATIONS

International Search Report in PCT/JP2009/050470.
James G Pipe (1999), "Motion Correction with Propeller MRI: application to Head Motion and Free-Breathing Cardiac Imaging", Magnetic resonance in Medicine, vol. 42, pp. 963-969.

* cited by examiner

*Primary Examiner* — Dixomara Vargas
(74) *Attorney, Agent, or Firm* — Cooper & Dunham LLP

(57) ABSTRACT

The contrast of an image obtained by using a multi-echo sequence with hybrid-radial sampling is improved by dividing echo signal groups of one or more blocks measured by executing the imaging using the multi-echo sequence, into a plurality of partial echo signal groups, each of which is used to reconstruct an image with different contrast from each other.

15 Claims, 15 Drawing Sheets

FIG. 7
(a)
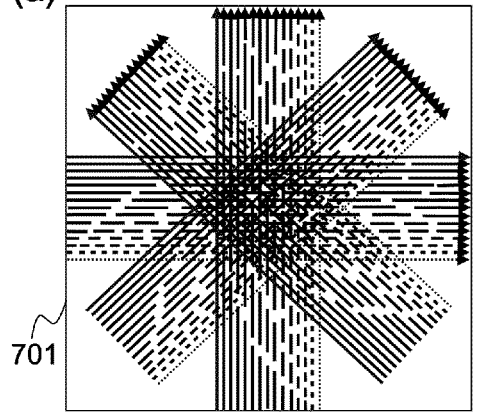 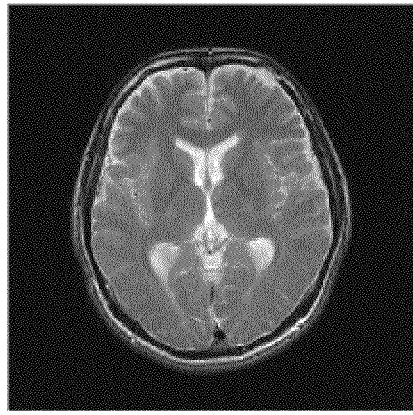
701  704
(b)
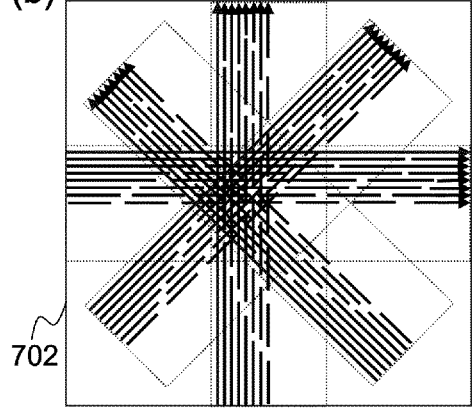 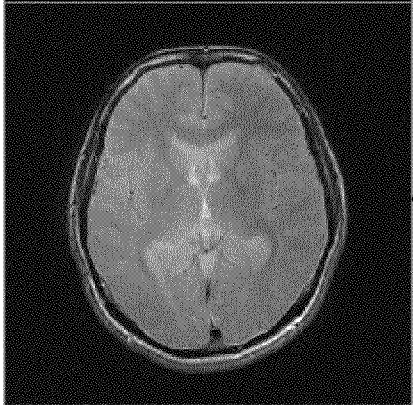
702  705
(c)
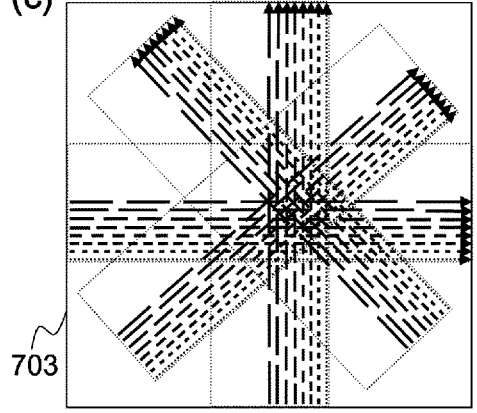 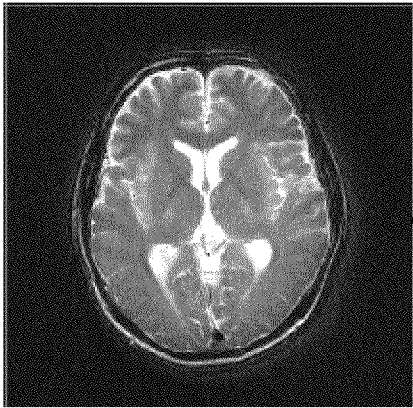
703  706

FIG. 10
(a)
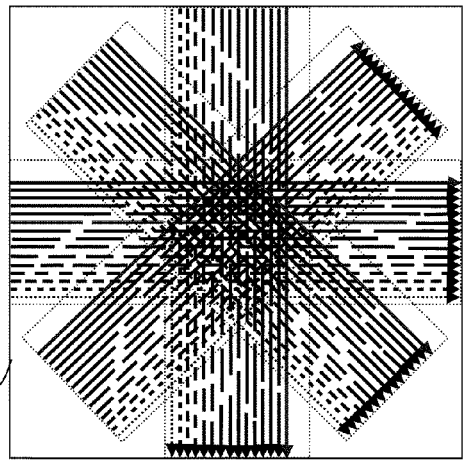
(b)
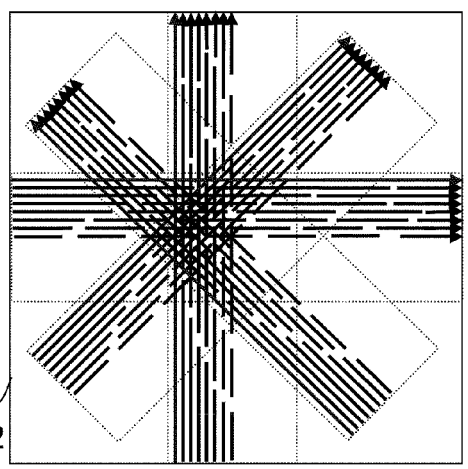
(c)
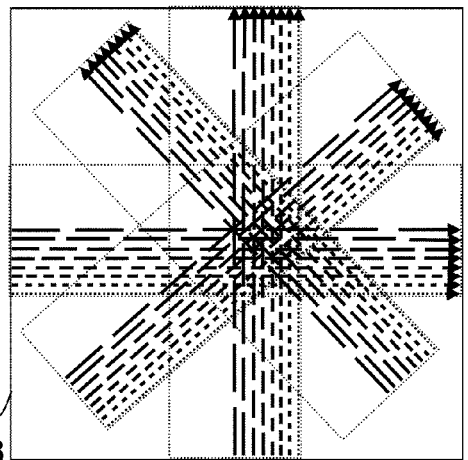

FIG. 14
(a)
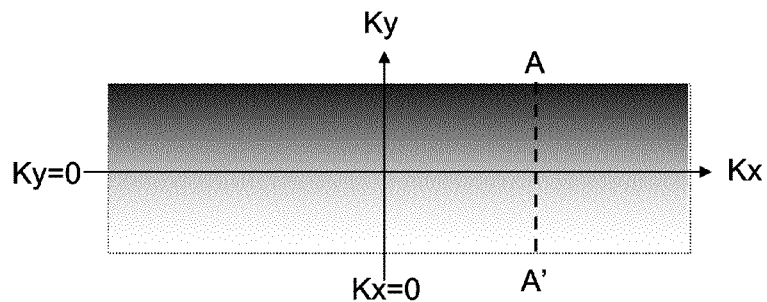
(b)
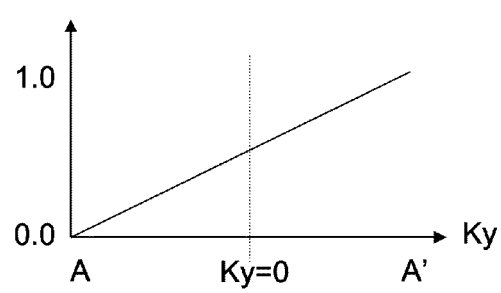
(c)
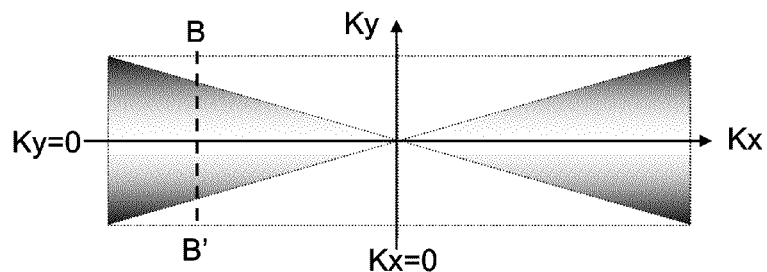
(d)
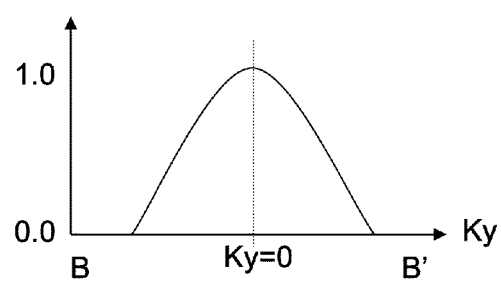

MAGNETIC RESONANCE IMAGING APPARATUS AND MULTI-CONTRAST ACQUIRING METHOD

FIELD OF THE INVENTION

The present invention is related to a technique of multi-echo sequence using the radial sampling method in a magnetic resonance imaging (hereinafter referred to as MRI) apparatus that obtains a tomographic image of an examination region in an object to be examined using nuclear magnetic resonance (hereinafter referred to as NMR) phenomenon.

DESCRIPTION OF THE RELATED ART

In MRI apparatuses, when an object moves during imaging, artifacts which appear as if the image streaked in the phase encode direction (hereinafter referred to as body-movement artifacts) are generated which affect the entire image. This phenomenon is caused, upon sampling the echo signal of the respective lattice points on a measurement space (so-called "K-space", and hereinafter referred to as K-space), generally because the sampling which is parallel to the frequency encode direction is repeated in the phase encode direction (hereinafter referred to as "Cartesian sampling method").

There is the non-Cartesian sampling method as opposed to the Cartesian sampling method, and the representative method thereof is the radial sampling method (refer to [Non-patent Document 1]).

The radial sampling method is a technique that executes sampling of echo signals radially while changing the rotation angle centering on approximately one point (generally the original point) in a K-space and measures the echo signals necessary for constructing an image. In the image obtained by radial sampling method, since the echo signals are sampled radially, body-movement artifacts are scattered around the image (i.e. scattered outside of a region of interest). Therefore, the body-movement artifacts are modest compared to the Cartesian sampling method, and is referred to as robust with respect to the body movement.

On the other hand, the multi-echo sequence that measures a plurality of echo signals by one-time irradiation of a high-frequency magnetic field has been proposed, and is widely known as the fast-spin echo sequence (hereinafter referred to as the FSE sequence) or echo planar sequence (hereinafter referred to as the EPI sequence). The hybrid radial method ([Non-patent Document 2] referred to as the propeller MRI method in this document) wherein the radial sampling method and previously mentioned multi-echo sequences are combined, using the phase encode has the characteristic of the radial sampling method, while being applicable to the sequence diagram of the multi-echo sequence.

In multi-echo sequence, the tissue contrast information that the respective echo signals have are different, since the respective echo signals have different elapsed times from irradiation of a high-frequency magnetic field. While a piece of image is usually reconstructed using all of the measured echo signals, the multi-contrast method has been also proposed which divides the measured echo signals into a plurality of groups based on the echo time (time intervals from irradiation of a high-frequency magnetic field to the peak of the echo signal thereof) and reconstructs an image for every group using the echo signals thereof (Patent Document 1, Patent Document 2).

Patent Document 1: JP-A-H11-89813
Patent Document 2: JP-A-H9-276249
Patent Document 3: JP-A-H7-31605
Non-Patent Document 1: G. H. Glover et al., Projection Reconstruction Techniques for Reduction of Motion Effects in MRI, Magnetic Resonance in Medicine 28: 275-289 (1992)
Non-Patent Document 2: James G. Pipe, Motion Correction with PROPELLER MRI: Application to Head Motion and Free-Breathing Cardiac Imaging, Magnetic Resonance in Medicine 42:963-969 (1999)
Non-Patent Document 3: J. I. Jackson et al., Selection of a Convolution Function for Fourier Inversion using Gridding, IEEE Trans. Med. Imaging, vol. 10, pp. 473-478, 1991

In the multi-echo sequence of the non-radial sampling method, the K-space is divided into the number of blocks which is the same number of the successive echo signals (echo train) measured in one shot, and the data of the number of echo signals which is the same number as the echo train number measured in each shot is placed in each block. As a result, the echo signals having a specific echo train number occupies a large proportion of a specific region in the K-space. Therefore, the multi-contrast method disclosed in Patent Document 1 is easy to execute by dividing such K-space data.

On the other hand, since the measurement trajectory in the K-space forms a radial pattern in the radial sampling method, trajectory of all measured echo signals passes through near the center of K-space (low-spatial frequency region) which is significant for image contrast. Especially, in the multi-echo sequence such as the FSE sequence or EPI sequence, data of the echo signals having different echo times are mixed near the center of the K-space. The image obtained by reconstructing such K-space data tends to have deteriorated contrast.

In order to prevent deterioration of image contrast, difference of elapsed times from the application of a high-frequency pulse between the echo signals should be made small. For doing that, the number of echo times to be measured after applying one time of high-frequency pulse needs to be reduced, or the time interval between measurements of one echo (inter-echo time) needs to be reduced. However, the former method has a demerit that the total imaging time has to be increased due to increase of the number of applications of a high-frequency magnetic field, and the latter method also has a demerit of inadequate signal-to-noise ratio due to increase of the reception bandwidth or lowering of the spatial resolution due to decrease in the number of acquired matrix.

In the above-mentioned Patent Documents 1 and 2, neither the above-described problems nor the solution thereof in regard to the multi-contrast method based on the multi-echo sequence of the radial sampling method are disclosed.

Given this factor, the objective of the present invention is to improve contrast of the image to be obtained by imaging using the multi-echo sequence based on the radial sampling method, considering the above-described problems.

BRIEF SUMMARY OF THE INVENTION

In order to solve the above-described problems, the present invention divides the echo signal group of one or more blocks measured by executing the imaging using the multi-echo sequence based on the radial sampling method into a plurality of partial echo signal groups, and reconstructs a plurality of images having different contrasts respectively using the divided partial echo signal groups. In concrete terms, the MRI apparatus of the present invention is characterized in comprising:

measurement controller configured to control the measurement of the echo signals generated from an object to be examined using an RF pulse and a gradient magnetic field to be applied to the object; and arithmetic processor configured to execute calculations including reconstruction of an image of the object using the echo signal, wherein:

the measurement controller repeats the measurement of the echo signal groups corresponding to the blocks formed by having a plurality of parallel trajectories on a K-space while changing rotation angle of the block centering on approximately one point in the K-space; and the arithmetic processor divides the echo signal group of one or more blocks into a plurality of partial echo signal groups respectively, and reconstructs the plurality of images respectively having different contrasts using the divided partial echo signal groups.

Also, the multi-contrast image acquiring method of the present invention comprises:

a measurement step that repeats measurement of the echo signal group from the object corresponding the block having a plurality of parallel trajectories on the K-space while changing rotation angle of the block centering on approximately one point in a K-space; and an arithmetic processing step that executes calculation including reconstruction of an image of the object using the echo signal group for each block, wherein the arithmetic processing step divides the echo signal group of one or more blocks into a plurality of partial echo signal groups, and reconstructs a plurality of images having different contrasts respectively using the divided partial echo signal groups.

In accordance with the above-described configuration, in the imaging using a multi-echo sequence based on the radial sampling method, the present invention is capable of simultaneously obtaining a plurality of images having different contrasts in one time of imaging without prolonging imaging time. Furthermore, contrast of the respective images is improved compared to the images obtained by reconstructing the measured echo signal groups without dividing the measured echo signal groups.

In a preferable embodiment of the present invention, arithmetic processing means executes division of the echo signal groups in a block by making one or more echo signals from among the echo signal group in the block overlap with two or more echo signal groups from among the plurality of partial echo signal groups.

In this manner, it is possible to obtain an image having two or more different contrasts while maintaining the number of echo signals to be acquired minimum.

Also, in a preferable embodiment of the present invention, measurement controlling means executes measurement of the echo signals in the block so that the distribution of the echo signals in the block becomes asymmetric in relation to the rotation center of the block.

Accordingly, the image having the contrast reflecting the intended echo time can be obtained.

Also, in a preferable embodiment of the present invention, arithmetic processing means executes division of the echo signal groups in a block by differentiating the number of echo signals to be collected as each partial echo signal group.

In this manner, it is possible to obtain an image having the most appropriate contrast according to the kind of contrast in the desired image to be obtained.

Also, in a preferable embodiment of the present invention, arithmetic processing means applies the spatial frequency filter for weighting on the data of the block corresponding to the partial echo signal group.

By doing so, contrast of the image can be further improved.

The MRI apparatus of the present invention is capable of reconstructing a plurality of images having different contrasts by dividing the echo signal group measured by a multi-echo sequence based on the radial sampling method into a plurality of sections and respectively reconstructing images from the divided partial echo signal groups. Also, contrast of the respective images is improved compared to the images obtained by reconstructing the measured echo signal groups without dividing. Furthermore, since a plurality of images having different contrasts can be obtained in one time of imaging, the imaging time can be reduced compared to the method which repeats imaging for a plurality of times.

BRIEF DESCRIPTION OF THE DRAWINGS

FIG. 7 is for explaining the K-space placement of the echo data after being divided and the image to be reconstructed using the divided echo data, in the first embodiment of the present invention.

FIG. 10 is for explaining the K-space placement of the echo data after being divided in the second embodiment of the present invention.

FIG. 12 is for explaining the outline on the division of an echo signal group in the fourth embodiment of the present invention.

FIG. 14 is for explaining the outline of the spatial selection filter in the sixth embodiment of the present invention.

FIG. 15 is for explaining an example of UI for setting a parameter group related to the present invention, in the seventh embodiment of the present invention.

DESCRIPTION OF REFERENCE NUMERALS

Figure 1:
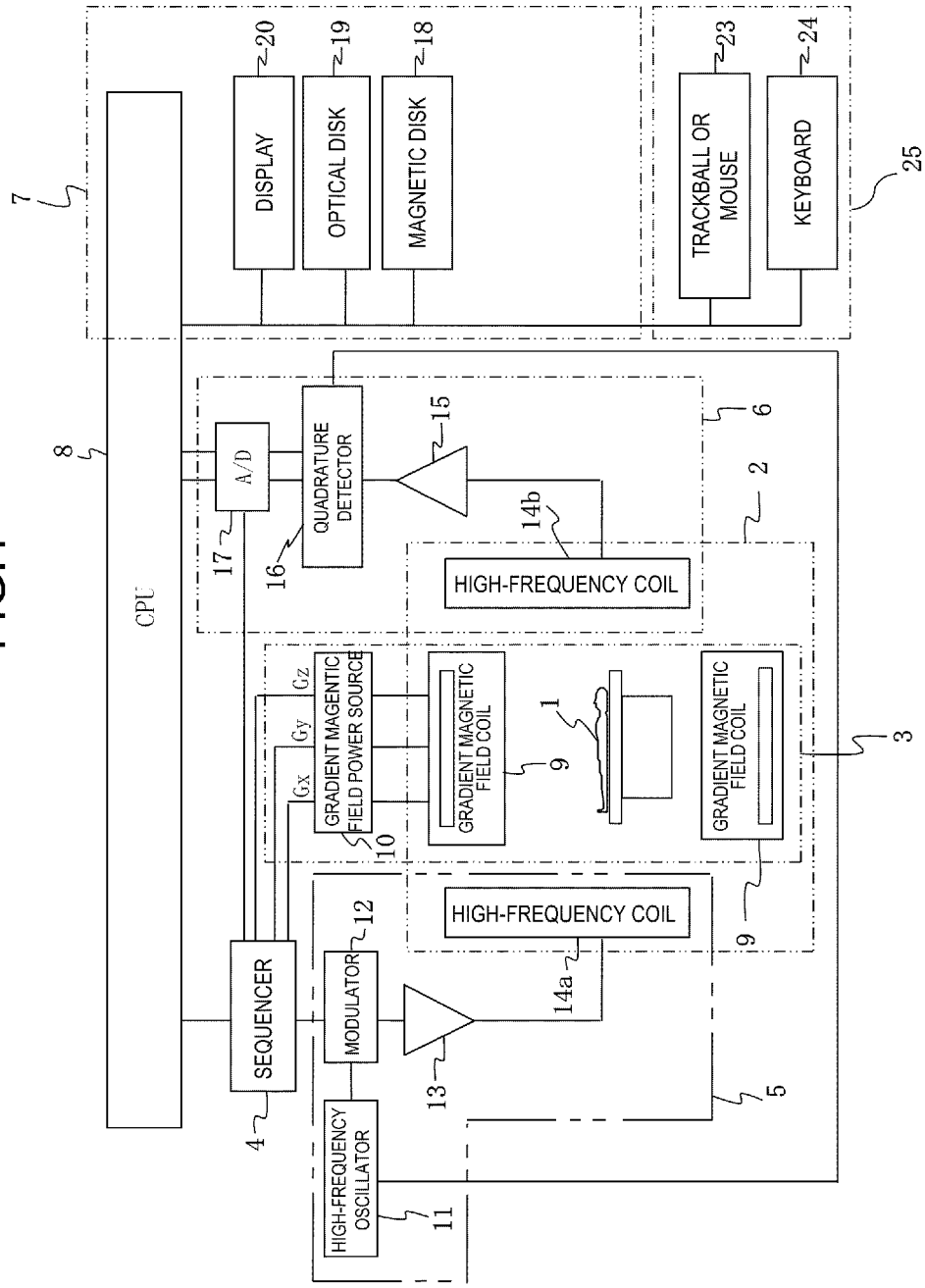
FIG. 1 is a block diagram showing the general configuration of the MRI apparatus to which the present invention is applied.

1: object, 2: static magnetic field generation system, 3: gradient magnetic field generation system, 4: sequencer, 5: transmission system, 6: reception system, 7: signal processing system, 8: central processing unit (CPU), 9: gradient magnetic field coil, 10: gradient magnetic field source, 11: high-frequency oscillator, 12: modulator, 13: high-frequency amplifier, 14a: high-frequency coil (transmission side), 14b: high-frequency coil (reception side), 15: amplifier, 16: quadrature detector, 17: A/D converter, 18: magnetic disk, 19: optical disk, 20: display

DETAILED DESCRIPTION OF THE INVENTION

The respective embodiments of the MRI apparatus related to the present invention will be described below referring to the diagrams. In all of the diagrams for explaining the respective embodiments for the MRI apparatus related to the present invention, the same function parts are represented by the same reference numerals, and the duplicative description thereof is omitted.

First, an example of the MRI apparatus and the multi-contrast image acquisition method related to the present invention will be described based on FIG. 1. FIG. 1 is a block diagram showing the general configuration of the MRI apparatus related to the present invention. The MRI apparatus is for obtaining a tomographic image of an object to be examined using nuclear magnetic resonance (NMR) phenomenon, and configured by comprising static magnetic field generation system 2, gradient magnetic field generation system 3, transmission system 5, reception system 6, signal processing system 7, sequencer 4 (measurement controller) and central processing unit (CPU) 8 (arithmetic processor) as shown in FIG. 1.

Static magnetic field generation system 2 is for generating a uniform static magnetic field in the space around object 1 in the body-axis direction thereof or the direction orthogonal to the body axis, and magnetic field generation means (not illustrated) of the permanent magnetic method, normal conductive method or superconductive method is placed around object 1.

Gradient magnetic field generation system 3 is formed by gradient magnetic field coil 9 wound in 3-axes directions of X, Y and Z and gradient magnetic field source 10 for driving the respective magnetic field coils 9, and applies gradient magnetic fields Gx, Gy and Gz in 3-axes directions of X, Y and Z to object 1 by driving gradient magnetic field source 10 of the respective coils according to the command from sequencer 4 to be described later. In concrete terms, it sets the slice plane with respect to object 1 by applying the gradient magnetic field of one direction from among X, Y and Z-directions as slice selection gradient magnetic field pulse (Gs), applying the gradient magnetic fields of the remaining two directions as phase encode gradient magnetic field pulse (Gp) and frequency encode (or readout) magnetic field pulse (Gf), and encodes the positional information of the respective directions to an echo signal.

Sequencer 4 is a measurement controller configured to control measurement of echo signals by repeatedly applying a high-frequency magnetic field pulse (hereinafter referred to as an "RF pulse") and a gradient magnetic field pulse to an object based on a predetermined pulse sequence (hereinafter referred to merely as a sequence). Sequencer 4 operates under control of CPU 8, and controls measurement of echo signals by transmitting various commands for measuring the echo signals necessary for reconstructing a tomographic image of object 1 to transmission system 5, gradient magnetic field generation system 3 and reception system 6 and controlling these systems.

Transmission system 5 is for irradiating RF pulses for causing nuclear magnetic resonance to atomic nuclei spin of atomic elements by which the biological tissues of object 1 are formed, and is configured by high-frequency oscillator 11, modulator 12, high-frequency amplifier 13 and high-frequency coil 14a on the transmission side. It irradiates an electromagnetic wave (RF pulse) to object 1 by amplitude-modulating the high-frequency pulse outputted from high-frequency oscillator 11 at the timing commanded by sequencer 4 by modulator 12, amplifying the amplitude-modulated high-frequency pulse by high-frequency amplifier 13 and providing the amplified high-frequency pulse to high-frequency coil 14a disposed in the vicinity of object 1.

Reception system 6 is for detecting the echo signal (NMR signal) eradiated by nuclear magnetic resonance of atomic nuclei spin by which the biological tissues of object 1 are formed, and is provided with high-frequency coil 14b on the reception side, amplifier 15, quadrature detector 16 and A/D converter 17. The electromagnetic wave (echo signal) which is the response of object 1, which is excited by the electromagnetic wave irradiated from high-frequency coil 14a on the transmission side is detected by high-frequency coil 14b disposed in the vicinity of object 1, amplified by amplifier 15, divided into diphyletic signals that are orthogonal to each other by quadrature detector 16 at a timing commanded by sequencer 4, converted respectively into digital amount by A/D converter 17 and transmitted to signal processing system 7. Hereinafter, the data of the echo signal converted into digital amount is referred to merely as echo data.

Signal processing system 7 has an external storage device (storage unit) such as optical disk 19 and magnetic disk 18 and display 20 formed by devices such as CRT. When the echo data from reception system 6 is inputted to CPU 8 (arithmetic processor), CPU 8 stores the echo data in a memory which is contained in CPU 8 and corresponds to the K-space (hereinafter, description about echo signals or echo data being placed in the K-space means that the echo data is written and stored in the memory). Then CPU 8 executes various arithmetic processes including signal processing and image reconstruction with respect to the K-space data, displays the tomographic image of object 1 which is the result of the arithmetic processing on display 20, and stores the image in an external storage device such as magnetic disk 18.

Operation system 25 is for inputting various control information of the MRI apparatus or control information of the process to be executed in the above-mentioned signal processing system 7, and formed by trackball or mouse 23 and keyboard 24. The operation system 25 is disposed in the vicinity of display 20, and an operator interactively controls various processing of the MRI apparatus via operation system 25 while observing display 20.

In FIG. 1, high-frequency coil 14a and 14b on transmission side and reception side and gradient magnetic field coil 9 are disposed in a static magnetic field space of static magnetic field generation system 2 which is disposed in the space around object 1.

The kind of imaging target spin of an MRI apparatus being used in clinical sites is proton which is the main component of an object. By constructing images of spatial distribution of proton density or spatial distribution of relaxation phenomenon in an excitation state, configuration or function of ahead region, abdominal region or four limbs of a human body can be 2-dimensionally or 3-dimensionally imaged.

Figure 2:
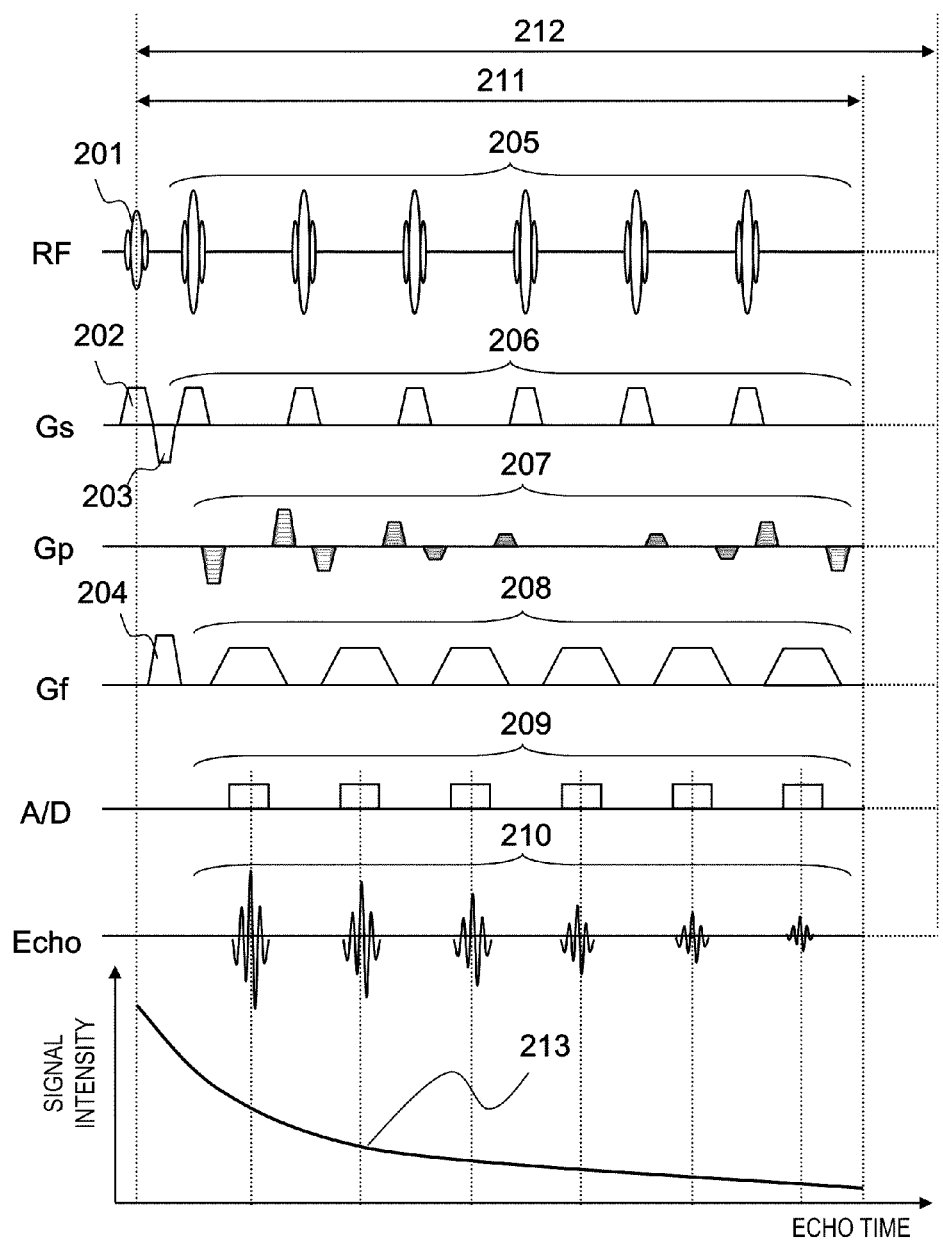
FIG. 2 is a sequence diagram for explaining the pulse sequence of the commonly used fast spin echo sequence to which the present invention is applied.

Next, FIG. 2 shows an example of the multi-echo sequence, and is the sequence of the FSE sequence in the hybrid radial method to be described later. In FIG. 2, RF, Gs, Gp, Gf, A/D and echo respectively indicate an RF pulse, slice gradient magnetic field, phase encode gradient magnetic field, frequency encode gradient magnetic field, A/D conversion and an axis of an echo signal.

Also, 201 is the excitation RF pulse for providing a high-frequency magnetic field to the spin in an imaging plane, 202 is the slice selection gradient magnetic field pulse, 203 is slice re-phase pulse for returning the phase of the spin diffused by the slice selection gradient magnetic field pulse, 204 is a frequency diphase gradient magnetic field pulse for dispersing the phase of the spin in advance for generating an echo signal using the frequency encode gradient magnetic field pulse, 205 is an inverse RF pulse group for inversing the spin in the slice plane, and 206~210 are respectively slice selection gradient magnetic field pulse group (206) for selecting the slice, phase encode gradient magnetic field pulse group (207), frequency encode gradient magnetic field pulse group (208), sampling window group (209) and echo signal group (210) in each of the inverse RF pulse.

FIG. 2 shows an example that echo signal group 210 formed by 6 echo signals is measured for each excitation RF pulse 201 of one time, and sequencer 4 repeatedly executes the sequence shown in FIG. 2 in time interval (repetition time TR) 211 while changing the area of phase encode gradient magnetic field pulse group 207, and controls the measurement of all echo signals necessary for image reconstruction in time interval 212 (i.e. imaging time).

Usually the number of echo signals to be selected for one piece of image is 64, 108, 256, 512 and so on. Each measured echo signal 210 is respectively converted into digital data in reception system 6, and acquired as time series data formed by, for example, 128, 256, 512 or 1024, etc. of sampling data.

Also, 213 is an easement curve indicating the state that transverse magnetization component of the spin decreases after application of excitation RF pulse 201, and signal intensity of the respective measured echo signals 210 decreases in accordance with the easement curve. In FIG. 2, the amplitude is changed in accordance with signal intensity of the echo signal. The signal intensity will be illustrated in the diagrams below in the same manner.

Figure 3:
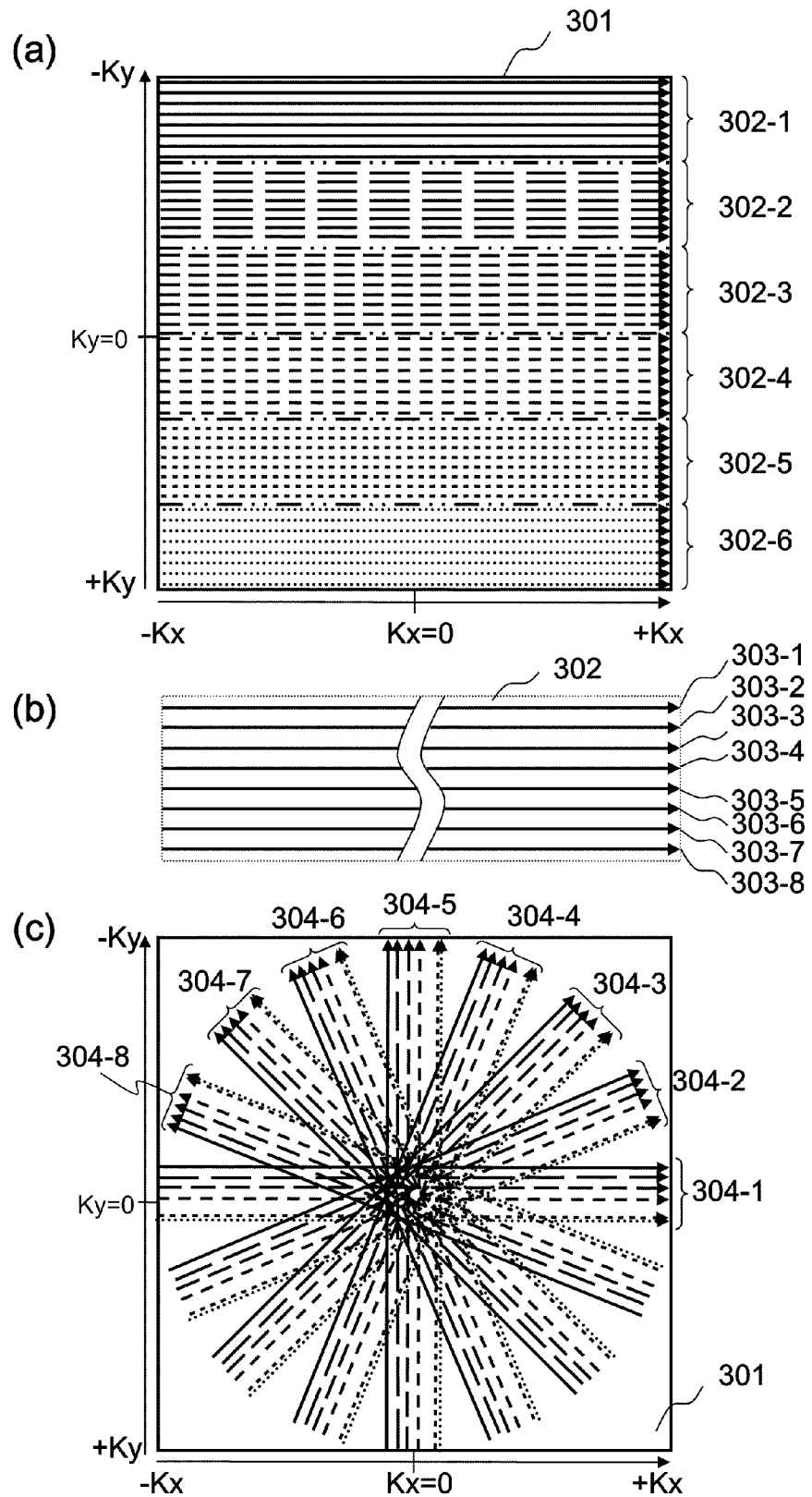
FIG. 3 is for explaining the imaging method and the echo data placement in a measurement space (K-space).

FIG. 3(a) shows the state that data of each echo signal measured using the sequence shown in FIG. 2 is placed in K-space 301. The arrow in FIG. 3(a) corresponds to one echo signal, and the direction of the arrow shows the direction that the echo signal is scanned on the K-space. Also, the length of the solid line part in the arrow corresponds to signal intensity of the echo signal shown in FIG. 2 (as the dotted line gets finer and also farther from the solid line (the direction from the side of −Ky to the side of +Ky in FIG. 3(a)), signal intensity decreases. This will be the same hereinafter). FIG. 3(a) shows the K-space data obtained by the FSE sequence of the multi-shot wherein echo signal group 210 formed by 6 echo signals in one time of excitation RF pulse 201 is measured and the measurement is repeated eight times.

Generally, the order of placing the echo data in the K-space is controlled by changing the application amount of each phase encode gradient magnetic field pulse 207 (the area encompassed by the pulse waveform and the time axis). FIG. 3(a) shows the sequential order that the data of an echo signal group are placed in the K-space from top to the bottom in the Ky-direction (i.e. from the side of −Ky to the side of +Ky). Further, FIG. 3(a) shows the case that each phase encode gradient magnetic field pulse 207 is controlled so that the echo data which is measured at the same echo time (the elapsed time from irradiation of excitation RF pulse 201) are arranged for each block indicated by 302. Here, the hyphenated number after 302 corresponds to the echo number of the measured echo signal, and it means that the echo time gets longer as the hyphenated number increases.

FIG. 3(b) shows placement of echo data in a block which is extracted from among the blocks indicated by 302 and enlarged. The hyphenated numbers of 303 correspond to the repetition number (shot number) of time interval 211, and FIG. 3(b) shows the state that the echo signals are measured in order from the top (i.e. from −Ky side of the Ky-direction toward the +Ky side).

To show contrast in an MRI image, contrast information that the echo data placed in the low-spatial frequency region (i.e. the vicinal region centering on the original point (Kx=Ky=0)) of K-space 301 is significantly reflected. In the case of FIG. 3(a), since the echo data of blocks 302-3 and 302-4 is placed in the low-spatial frequency region in the Ky-direction, the contrast information at the time when these echo data are measured is reflected to the contrast of the image.

Generally in imaging of a head-region using an MRI apparatus of 1.5 tesla, echo time (TE) for obtaining a T1-enhanced image using the sequence of the spin-echo type is about 15 ms and repetition time (TR) of the sequence is about 500 ms, TE for obtaining T2-enhanced image is about 80 ms and TR is about 4000 ms, and TE for obtaining a proton-enhanced image is about 15 ms and TR is about the same as obtaining a T2-enhanced image. In order to achieve these times, the respective parameters of the sequence are adjusted.

Figure 4:
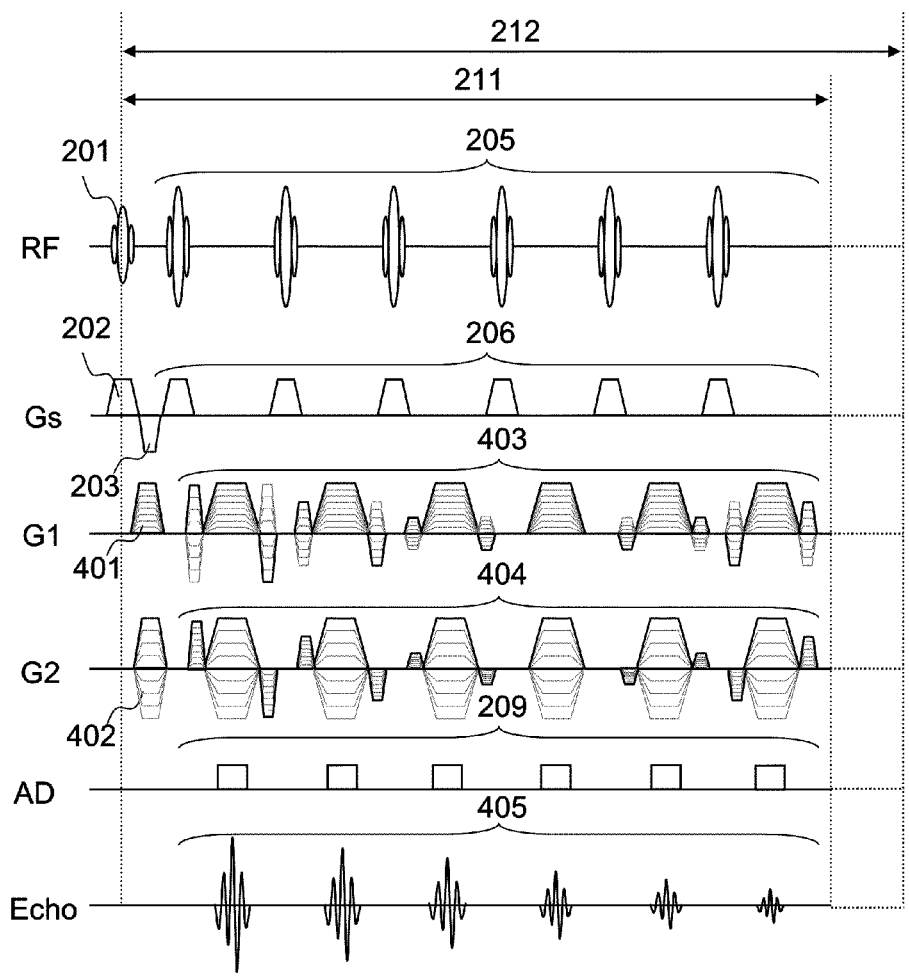
FIG. 4 is a sequence diagram for explaining the pulse sequence of the hybrid radial method to which the present invention is applied.

Next, FIG. 4 shows an example of an FSE sequence of the hybrid radial method provided to the MRI apparatus and the multi-contrast image acquisition method of the present invention, which is a kind of radial sampling method and is combined with a phase encode. An obvious difference from the FSE sequence in FIG. 2 is that there is no distinction between phase encode gradient magnetic field axis Gp and frequency encode gradient magnetic field axis Gf (indicated by axes G1 and G2 in FIG. 4 for the sake of convenience).

The difference from the Cartesian sampling method is that sequencer 4 measures echo signal group 405 by changing, for each repetition 211 of the pulse sequence, the respective amplitudes of frequency diphase gradient magnetic field pulses 401, 402, gradient magnetic field pulse groups 403 and 404 to be applied to the two axes (G1 and G2-axes) in the slice plane. By such control, a plurality of echo signals which belong to the respective blocks having a relationship being rotated radially centering on approximate one point (generally the original point) in the K-space are measured. Then sequencer 4 repeats the sequence in FIG. 4 for the number of blocks, and acquires the K-space data necessary for reconstructing a piece of image in image acquisition time 212.

FIG. 3(c) is an example that data of the respective echo signal are placed in K-space 301 and are measured using the sequence in shown in FIG. 4. Each block 304 is formed by the echo data of echo signal group 405 measured in one time irradiation of excitation RF pulse 201, an arrow corresponds to an echo signal and the direction of the arrow indicates the scan direction of the echo signal as in FIG. 3(a). Also, the length of the solid line of an arrow corresponds to signal intensity of the echo signal shown in FIG. 4. Further, the hyphenated numbers beginning with 304 correspond to the repetition number (shot number) time interval 211, and FIG. 3(c) is the case that the sequence in FIG. 4 is controlled so that the echo data in K-space 301 is acquired by rotating the block for 8 steps in counterclockwise direction within the half-round angle (180-degrees) of the K-space.

FIG. 3(c) shows the K-space data acquired by the hybrid radial method, and echo data of the respective blocks 304 are overlapped near the center of K-space which is significant for image contrast. By such placement of the data, while motion artifacts in an image are reduced with influence of body motion upon measurement of the echo data being averaged out in the center of the K-space, it is difficult to reflect the contrast information of the echo data acquired at a specific echo time to an image compared to the Cartesian sampling in FIG. 3(a).

Figure 5:
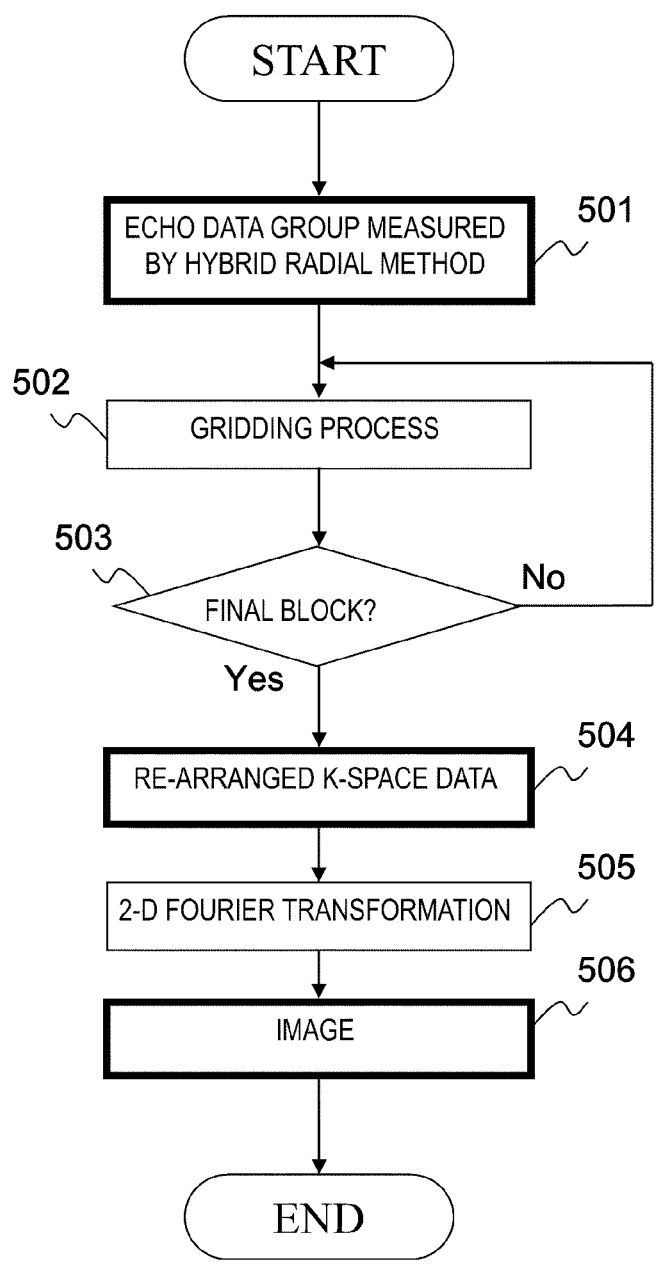
FIG. 5 is a processing flowchart for explaining the reconstruction in the non-Cartesian sampling method.

FIG. 5 shows a flowchart example for image reconstruction using the K-space data acquired by the hybrid radial method as shown in FIG. 3(c). The outline of the processing flow will be described below. In all flowcharts in the present specification, thick frames indicate processing results and thin frames indicate each process.

After echo data group 501 is measured for each block using the sequence of the hybrid radial method, the gridding process is to be executed in step 502 with respect to echo data group 501 in one block (hereinafter abbreviated as merely block data). The coordinate of the respective sample points of each block data 501 does not match the coordinate of the regular lattice point in the K-space at the timing right after the block data is measured. Given this factor, CPU 8 creates K-space data 504 by rearranging such one block data 501 on the respective lattice points in the K-space applying interpolation process 502 which is generally referred to as gridding.

In step 503, whether gridding process 502 is executed for all of the block data or not is determined. If the gridding process is not executed the procedure returns to step 502. If the gridding process is executed, rearranged K-space data 504 is created and step 505 is to be carried out. While gridding process 502 can be executed to data of every echo signal, it is more effective to execute the process for each block of echo signal data since delimiters for blocks and shots are often set in the same way in a multi-echo sequence. The present processing flow shows the case that the gridding process is executed for each block of echo signal data, wherein CPU 8 determines whether gridding 502 is executed for all block data or not and executes gridding process 502 for block of echo signal data until the final block. The gridding process here is executed using an interpolation function, for example, a Sinc function or Kaiser-Bessel function ([Non-patent Document 3]).

In step 505, K-space data 504 is 2-dimensionally Fourier transformed and an image is reconstructed. CPU 8 applies 2-dimensional Fourier transform to K-space data 504 which is rearranged after the gridding process in the same manner as the K-space data acquired by the Cartesian sampling method, and reconstructs image 506.

The processing flow of image reconstruction using the K-space data acquired by the hybrid radial method has been described above.

In the hybrid radial method, since the data of a low-spatial frequency region is sampled in the K-space of each block, it is characterized in that images of the low-spatial resolution can be constructed from these acquired low-spatial frequency data. Given this factor, the method for correcting the movement of an object between the blocks by a correlation process, etc. using the above-mentioned images of low-spatial frequency has been proposed (Non-patent Document 2). In this case, the body-movement correction process is either to be executed prior to gridding process 502 or incorporated in the gridding process.

First Embodiment

Next, the first embodiment of the MRI apparatus and multi-contrast image acquisition method related to the present invention will be described. The present embodiment divides the respective echo signals of one or more blocks measured by the sequence of the hybrid radial method into a plurality of partial echo signal groups, and reconstructs an image respectively having different contrasts using each of the divided partial echo signal groups. Further, upon dividing the echo signal group of one or more blocks, one or more echo signals from among the echo signal group are to be overlapped with two or more of the plurality of partial echo signal groups. The present embodiment will be described below in detail using the attached diagrams.

First, the outline of the present embodiment will be described referring to FIGS. 6 and 7.

FIG. 6(a) shows echo signal group 601 in one time of repetition 211 measured by executing the sequence of the hybrid radial method shown in FIG. 4, in the case that 14 echo signals are measured in one time of repetition 211. The echo signal in the present embodiment is not limited to 14, and may be less than 13 or more than 15. Also, the position indicated by echo time TE in FIG. 6(a) is the position corresponding to the center of the K-space (i.e. Ky=0). Display and explanation of the other axes will be omitted since they are the same as FIG. 4.

As previously mentioned, in the hybrid radial method, the data of echo signal group 601 measured in one time of repetition is placed in the K-space data so as to form one block, which is shown in FIG. 6(b). While the block data is shown by setting the vertical axis as Ky and the lateral axis as Kx in FIG. 6(b), since the rotation angle on the K-space varies for each block in the sequence of the hybrid radial method, correspondence relationship between the output direction after synthesis of gradient magnetic fields and the Ky, Kx-axes varies along with the rotation angles. However, in the present embodiment, the block data is shown by the coordinate system by setting the phase encode direction as Ky and the frequency encode direction as Kx without considering the output direction after synthesis of gradient magnetic fields for the sake of simplicity. The coordinate system of the block data will be shown in the same manner in the following description.

Based on such measured echo signal group 601, CPU 8 makes one or more echo signals in the vicinity of TE to be included in both of the partial echo signal groups. In other words, CPU 8 selects the echo signal corresponding to the low-spatial frequency region in the K-space as the echo signal to be overlapped with both of the partial echo signal groups. Then CPU 8 divides echo signal group 601 into 8 signals on the anterior side and 8 signals on the posterior side based on TE, i.e. to make them have the same number of echo signals, and creates two partial echo signal groups 602-1 and 602-2. In other words, echo signal group 601 is divided into partial echo signal group 602-1 wherein the echo signals having a short elapsed time from irradiation of RF pulse 201 are collected and partial echo signal group 602-2 wherein the echo signals having a long elapsed time from irradiation of RF pulse 201 are collected. The benchmark of the division is not limited to TE, and other timings may be used instead. Also, the number of echo signals can be differentiated between the divided echo signal groups (an example of unevenly divided echo signal groups will be hereinafter described).

By the division as described above, block data 603 shown in FIG. 6(c) and block data 604 shown in FIG. 6(d) are created. The shaded region in block data 603 and 604 are the region where no echo data is placed. In these two blocks, one or more echo data near TE are shared in the vicinity of Ky=0. In other words, one or more echo data in the vicinity of Ky=0 are the same in block data 603 and 604. The number of blocks wherein the same echo signals are overlapped with a plurality of partial echo signal groups should be one or more.

In measurement by the multi-echo sequence of the non-radial sampling method, as previously described, the echo data having the same echo train number measured in each shot are placed near the center of the K-space. Therefore, in the case that the same echo signal group is divided by being overlapped with the same echo signals as in the present embodiment, the contrast of the image which is reconstructed using the partial echo signal groups created by the division is greatly influenced by contrast information of the echo data which is chosen to be overlapped.

On the other hand, in measurement by the multi-echo sequence of the radial sampling method, since data of the respective echo signals are placed quite contiguously in each block, contrast information that the echo data outside of the region of the selected echo data to be overlapped has largely contributes to the image compared to the measurement by the multi-echo sequence of the non-radial sampling method. Further, since the K-space is rotated for each block, the echo data on the outside of the overlapped selected region of the other blocks is added to the overlapped selected region near the center of the respective blocks. This makes contrast of the image constructed by the respective partial echo signal groups which are generated by the division significantly different.

FIG. 7 shows an example of the image constructed from different partial echo signal groups. FIG. 7 shows pattern diagrams wherein the data of the echo signal groups measured by the hybrid radial method shown in FIG. 6 are placed in the K-space, and examples of images obtained by reconstructing the K-space thereof. The pattern diagrams in FIG. 7 show the case for explanation that 56 echo signals are measured and repeated the measurement 4 times.

FIG. 7(a) shows K-space data 701 created using all of the echo signal groups measured by the conventional hybrid radial method and image 704 reconstructed using K-space data 701 thereof. FIG. 7(b) shows K-space data 702 created using only block data 603 generated from 8 partial echo signal groups 602-1 on the anterior side from among echo signal groups 601 in the same manner as FIG. 6(c), and image 705 reconstructed using K-space data 702 thereof. Also, FIG. 7(c) shows K-space data 703 created using only block data 604 generated from 8 partial echo signal groups 602-2 on the posterior side from among echo signal groups 601 in the same manner as FIG. 6(d), and image 706 reconstructed using K-space data 703 thereof (While a smaller number of blocks are illustrated for the purpose of explanation for data of each K-space in FIG. 7, the images are reconstructed using the K-space formed by a greater number of blocks).

FIGS. 7(b) and (c) have significantly different contrast of images. This is the result of selectively using the echo signals in different times by dividing the echo signal groups of the measured blocks, and the difference of contrasts between the two images becomes greater depending on the degree of difference in echo times between the respective partial echo signal groups that are the base of the two images.

In the case that the K-space data is asymmetrically acquired in the Ky-direction in the imaging using the non-radial sampling method, spatial resolution of the image reconstructed using the asymmetric data is lowered. This is because information on the spatial frequency can not be acquired correctly since the K-space data on one side in the Ky-direction has a deficit and is zero. On the other hand, in the hybrid radial method, the data will not have a deficit in a specific direction even when data block is acquired asymmetrically as shown in FIGS. 7(b) and (c) since each block is rotated centering on approximately one point in the K-space. For this reason, in the imaging using the hybrid radial method, lowering of spatial resolution is less compared to the imaging by the non-radial sampling method even when the block data are dissymmetric in the K-space as a result of each data block being acquired asymmetrically.

Next, the processing flow of the present embodiment will be described in accord with the above-mentioned outline of the present embodiment based on the flowchart shown in FIG. 8. The processing flow of the present embodiment is based on the processing flow of image reconstruction using the K-space data acquired by the radial sampling method shown in FIG. 5, and the processing steps that are specific to the present embodiment are added thereto. The respective processing steps will be described in detail below based on FIG. 8.

In step 801, measurement of the echo signal groups corresponding to each block is executed. Sequencer 4 controls gradient magnetic field generation system 3, transmission system 5 and reception system 6 based on the sequence of the hybrid radial method, rotates the block centering on approximately one point in the K-space, and measures the echo signal groups corresponding to each block. As a result, echo signal group 802 for each block can be acquired for all of the blocks. These echo signal groups 802 for each block are similar to echo signal groups 501 for each block in FIG. 5.

In step 803, the echo signal group corresponding to one block is divided into two. CPU 8 selects the echo signal group corresponding to one block from among echo signal groups 802 of all the blocks measured in step 801, and divides it into the partial echo signal group of the anterior side and the partial echo signal group of the posterior side so that one or more echo signals in the vicinity of TE are included in both of the partial echo signal groups on the basis of the previously set echo time TE. Then CPU 8 creates block data 804 for image 1 from the partial echo signal group of the anterior side and block data 805 for image 2 from the partial echo signal group of the posterior side respectively. At this time, the divided block data 804 and 805 correspond to block data 603 and 604 in FIG. 6 respectively.

Since division of the echo signal group needs to be executed on at least one block, step 803 may be skipped when the division process is not necessary to be executed. When division is not to be executed, CPU 8 carries out subsequent processing assuming the data of the echo signal group of the block is block data 804 and 805 for image.

In step 502, K-space data for each image is created using the interpolation process. This step is similar to step 502 in FIG. 5. CPU 8 generates K-space data 806 for image 1 by rearranging block data 804 for image 1 on the lattice points in the K-space for image 1 using the interpolation process referred to as "gridding". In the same manner, CPU 8 generates K-space data 807 for image 2 from block data 805 for image 2.

In step 503, whether gridding process 502 is executed for all of the blocks or not is determined. This step is similar to step 503 in FIG. 5. CPU 8 determines whether gridding process 502 is executed to all of the block data or not. If there are blocks not yet processed, CPU 8 selects one block among them, returns to step 803, and executes gridding process 502 for block data of the unprocessed block. When all of the blocks are executed with gridding process 502, CPU 8 pulls out of the loop. This step 503 is to be executed in the same manner between the processing flow for image 1 and processing flow for image 2.

In step 505, an image is reconstructed using K-space data for each image. This step is similar to step 505 in FIG. 5. CPU 8 2-dimensional Fourier transforms the generated K-space data 806 for image 1 and K-space data 807 for image 2 respectively so as to obtain image 1 (808) and image 2 (809) which have different contrasts.

The processing flow of the present embodiment has been described above. While the example that the division of echo signals is executed for each block after measuring the echo signal group corresponding to all the blocks in the above-described processing flow, measurement and division of the echo signal group may be repeated for each block. In this case, the determination step of step 503 does not return to step 803 but returns to step 801, measurement of echo signal group in step 801 is executed to the echo signal corresponding to a specific block, and the echo signal group in 802 becomes the echo signal group of the measured block.

As described above, in accordance with the MRI apparatus of the present embodiment, it is possible to construct a plurality of images having different contrasts only by the post-processing, without extending the imaging time nor major change in the sequence or image reconstruction compared to the images reconstructed using the sequence and echo data of the conventional hybrid radial method, by dividing one or more echo signal groups measured by the sequence of the hybrid radial method into a plurality of partial echo signal groups and constructing the respective images using echo data of each partial echo signal group. That is, the present embodiment has the first effect that a plurality of images having different contrasts can be obtained simultaneously in one time of the sequence by the hybrid radial method.

Also, the present embodiment has the second effect that, upon dividing the echo signal group of the measured block into a plurality of partial echo signal groups, a plurality of images having different contrasts can be constructed without changing the application pattern of the phase encode pulse upon measuring the echo signal by overlapping one or more echo signals in the vicinity of TE with the respective divided partial echo signal groups on the basis of the previously set echo time TE. On the other hand, in the non-radial sampling method, the position that the data of the measured echo data is placed in the K-space depends only on the total application amount of the phase encode pulses applied upon measurement of the echo signal. Therefore, it is necessary to change the application pattern of the phase encode pulse upon measuring the echo signal in order to make a significant change in contrast of the image.

Also, in the hybrid radial method, each data block is placed radially in the K-space by passing through the center thereof. For this reason, the ratio that all of the echo data to be used for image reconstruction contributes to contrast of the image is greater compared to the case of the non-hybrid radial method. In other words, the range of the echo time wherein the entire echo data to be used for image reconstruction is measured significantly contributes to the contrast of the image. Consequently, the present embodiment has the third effect that even the echo signal group of the block is divided by overlapping a part of echo signal group, if the ranges of the echo time of the divided respective partial echo signal groups are significantly different, contrasts of the images to be respectively reconstructed using the respective partial echo signal groups are to be significantly different.

Also in the hybrid radial method, it is possible to correct body motion using an image of the low-spatial resolution constructed using the data of a low-spatial frequency region in the K-space as previously described. In order to correct body motion, the number of echo signals to form one block needs to be more than a predetermined number, and generally needs a number of echo signals which is more than 16 echoes.

In the FSE sequence, since the echo signals for forming one block are measured by one shot, increasing the number of echo signals to be measured in one shot results in deterioration of image contrast, even though it enables the correction of body motions. Or contrarily, in the case of obtaining an image having contrasts wherein TE is short, it is necessary to set the echo time short. Therefore, when obtaining a T1 enhanced or proton-enhanced image using the conventional hybrid radial method, only a few echo signals can be measured in one shot, whereby making it impossible to apply body-motion correction.

The present embodiment, on the other hand, has the fourth effect that body motions can be corrected since many echo signals are measured for each block as in the conventional hybrid radial method. In order to further apply the body-motion correcting process to the present embodiment, after the measured echo signal group is performed with the body-motion correcting process, the echo signal group should be divided for reconstructing images of the respective contrasts.

Second Embodiment

Figure 9:
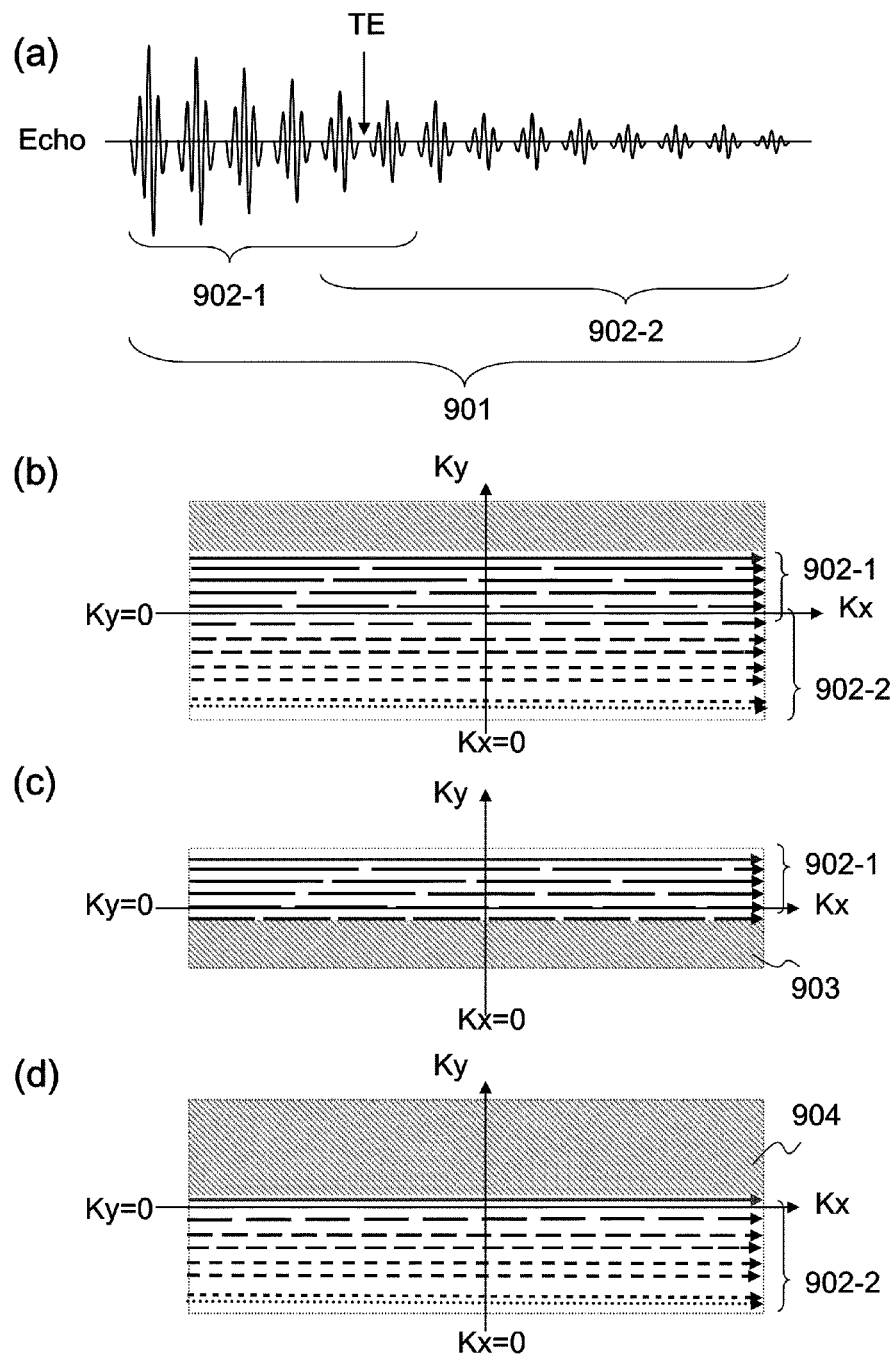
FIG. 9 is for explaining the outline on the division of an echo signal group in the second embodiment of the present invention.

Next, the second embodiment of the MRI apparatus and multi-contrast image acquisition method related to the present invention will be described. While an example that the echo signal group of the block is divided so that the numbers of echo signals to be collected as each partial echo signal group are to be approximately the same as described in the first embodiment, the present embodiment divides the echo signal group of the block, with respect to the echo signal group of one or more blocks, by differentiating the numbers of echo signals to be collected as a partial echo signal group. All but this point is the same as the first embodiment. Only the difference from the first embodiment will be described below based on FIG. 9, and the explanation on the same part will be omitted.

FIG. 9(a) shows echo signal group 901 in one time of repetition 211 measured by executing the sequence by the hybrid radial method shown in FIG. 4, illustrating the case that 14 echo signals are measured in one time of repetition as in FIG. 6(a). The difference of the sequence shown in FIG. 9(a) from the sequence shown in FIG. 6(a) is that the sequence is controlled, upon measurement of echo signal group 901, so that measurement timing of the echo signal corresponding to the vicinity of the origin of the K-space is to be shifted more to the anterior side i.e. in the direction that the echo time is shorter than the case of FIG. 6(a). When sequencer 4 executes the sequence of the hybrid radial method in such manner, the numbers of echo signals turn out to be different between the times measured before and after the previously set TE (i.e. the number of echo signals before TE turns out to be less than the number of echo signals after TE). Also, echo data 902 in the block is placed while being displaced toward lower side with respect to the Kx-axis (i.e. the negative side of the Ky-direction) as shown in FIG. 9(b). In other words, distribution of echo signals in the block becomes asymmetrical with respect to the rotation center (Kx=Ky=0) of the block.

Figure 8:
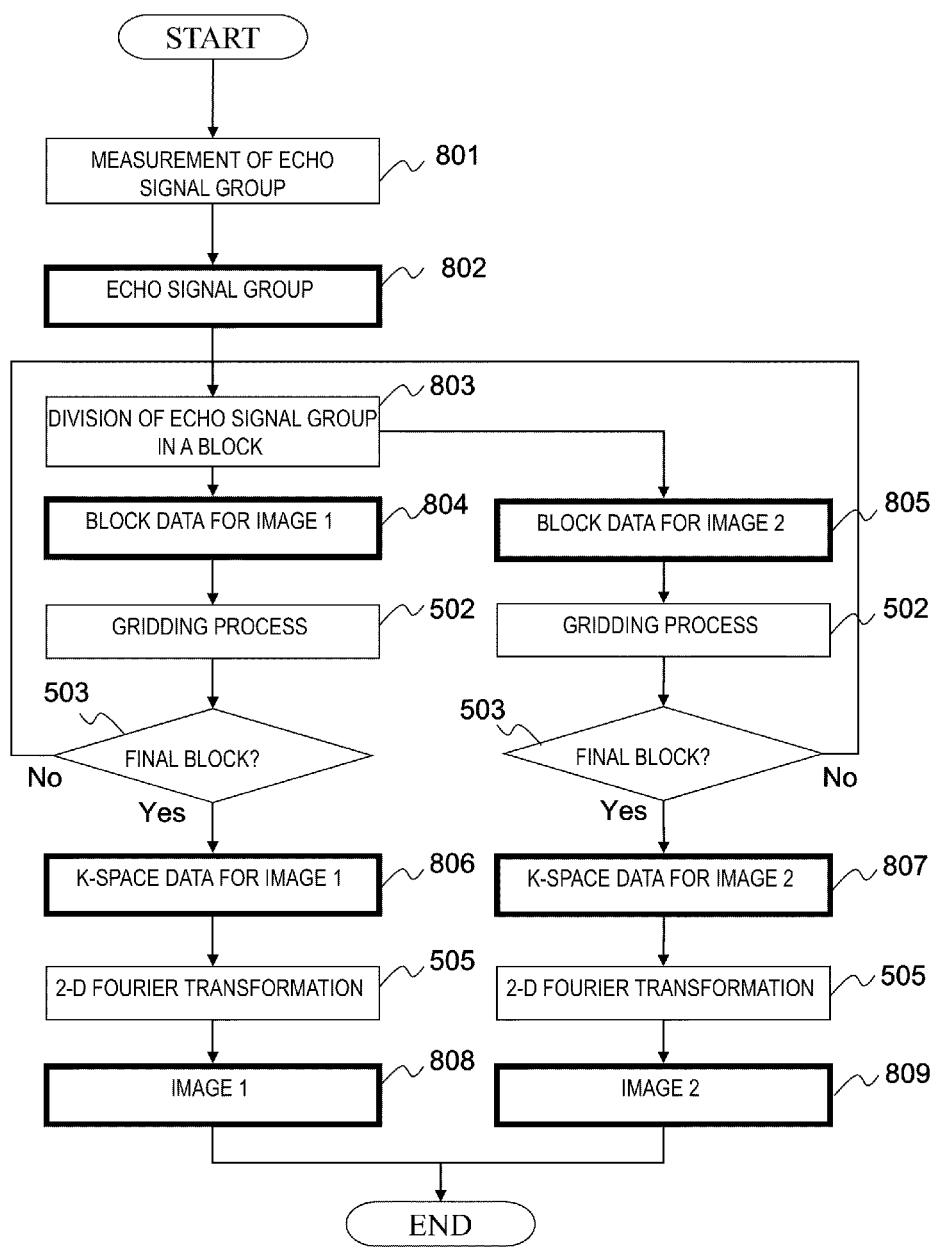
FIG. 8 is a processing flowchart of the first embodiment related to the present invention.

From echo signal group 901 of such measured block, two images having different contrasts are reconstructed respectively by the same processing flow as in FIG. 8. The only difference is the method for dividing the echo signal group in each block in step 803 as will be described below.

CPU 8 creates two partial echo signal groups 902-1 and 902-2 by dividing echo signal group 901 of the measured block into 5 echo signals on the anterior side and 10 echo signals on the posterior side on the basis of the previously set TE so that one or more echo signals near TE are included in both of the partial echo signal groups. In other words, CPU 8 divides echo signal group 901 so that the number of echo signals to be collected as partial echo signal group 902-1 formed by the echo signals having a short elapsed time from irradiation of RF pulse 201 becomes less than the number of echo signals to be collected as partial echo signal group 902-2 formed by the echo signals having a long elapsed time.

FIGS. 9(c) and (d) show the block data created based on the above-mentioned two partial echo signal groups. CPU 8 creates block data 903 shown in FIG. 9(c) from partial echo signal group 902-1 and block data 904 shown in FIG. 9(d) from partial echo signal group 902-2 respectively. In this case also, the shaded regions in the respective blocks are the region where no echo data is placed as in FIG. 6. That is, each block region is set to be symmetric in the Ky-direction with respect to the Kx-axis by setting the same size of the region where there is no placement of echo data to the region on the side that echo data is placed with respect to Kx-axis. In this example, the width of block data 903 in the Ky-direction of the block is narrow because the number of echo data is small, and contrarily the width of block data 904 in the Ky-direction of the block is wide because the number of echo data is large.

FIG. 10 shows the state that these block data are placed in the K-space. Since the position near the origin of K-space in the respective blocks in the K-space data of FIG. 10(a) is shifted with respect to the K-space data of FIG. 7(a), the rotation center of K-space 1001 appears to be displaced with respect to the placement of echo signals in the block. In this case, the echo data placed in the central part of the K-space is the data measured near TE, image contrast is assumed to be better than the case of FIG. 7(a).

10(b) shows K-space data 1002 created based on block data 903 shown in FIG. 9(c), and FIG. 10(c) shows K-space data 1003 created based on block data 904 shown in FIG. 9(d). As previously described, since the division ratio of echo signal group 901 is different, the echo data amount of K-space 1002 in FIG. 10(b) which fills the K-space is less compared to K-space data 1003 in FIG. 10(c). However, K-space data 1002 in FIG. 10(b) can be used for obtaining the image to which contrast information in the set echo time (TE) is better reflected, since the range of the echo time in which echo data for filling the K-space is measured is narrower compared to K-space data 702 in FIG. 7(b).

Given this factor, by setting the narrow range of echo time in accordance with the contrast kind of the desired image, it is possible to obtain the image having the contrast kind in which contrast information of the target narrow echo time range is enhanced, for example, a proton-enhanced image or T2-enhanced image. In order to obtain a proton-enhanced image, echo time (TE) needs to be made short, and only echo signals in the narrow range of before and after the echo time (TE) need to be collected to make a partial echo signal group. Or in order to obtain a T2-enhanced image, the echo time (TE) needs to be set long and the echo signals measured within the narrow range of before and after the echo time (TE) are to be collected to make a partial echo signal group.

Also, while spatial resolution is lower in the image reconstructed using K-space data 1002 in FIG. 10(b) compared to the image reconstructed using K-space data 1003 in FIG. 10(c) since the number of echo data for forming the K-space data is less compared to the image reconstructed using K-space data 1003 of FIG. 10(c), spatial resolution therein can be improved by increasing the number of block data to be measured by making the rotation angle of the block smaller.

On the other hand, the image reconstructed using K-space data 1003 in FIG. 10(c) has a larger number of echo data for constructing the K-space data compared to the image reconstructed using K-space data 1002 in FIG. 10(b), whereby improving the spatial resolution and signal-to-noise ratio (SNR) due to summation effect.

The above-described unequal division of the echo signal group of the block does not necessarily have to be executed to all of the blocks, and needs to be executed only on one or more blocks. Also, unequal division may be executed between the blocks.

As mentioned above, in accordance with the MRI apparatus and multi-contrast image acquisition method of the present embodiment, it is possible to obtain images to which contrast information in the previously set echo time (TE) is better reflected by respectively measuring one or more block data unsymmetrically with respect to Ky=0 (Kx-axis) in each block (on the coordinate system of the block) so that the first effect described previously in the first embodiment is better enhanced. Further, by differentiating the number of echo signals to be collected as a partial echo signal group, it is possible to obtain images having most appropriate contrast in accordance with the contrast kind of the desired image.

Also, even though increasing the number of blocks to be measured for improving the spatial resolution of an image results in extension of imaging time, the MRI apparatus of the present embodiment is still capable of reducing the entire imaging time to a greater degree by not individually obtaining images having these plural contrast kinds. Also, even though the possibility that an object moves increases by imaging time being extended, deterioration of image due to body movement hardly occurs in the present embodiment since images obtained by the hybrid radial method have an advantage that motion artifact appear to be indistinctive.

Third Embodiment

Next, the third embodiment of the MRI apparatus and multi-contrast image acquisition method related to the present invention will be described. While an example is described in the first embodiment that an echo signal group in a block is divided by overlapping the same echo signal with a plurality of partial echo signal groups, the present embodiment divides an echo signal group in a block without overlapping the same echo signal with a plurality of partial echo signal groups, i.e. by differentiating the echo signal for every partial echo signal groups. All but this point is the same as the first embodiment. Only differences of the present embodiment from the first embodiment will be described below referring to FIG. 11, and explanation on the same content will be omitted.

In order not to overlap the same echo signal with a plurality of partial echo signal groups, the present embodiment measures a part of echo signals corresponding to the low-spatial frequency region in the K-space a plurality of times and distributes them respectively to different partial echo signal groups so as to differentiate the echo signals for each partial echo signals upon dividing the echo signal group of the block.

FIG. 11(a) shows application pattern (1101-1, 1102-1) of phase encode gradient magnetic field pulse (Gp) and echo signal group (Echo) 1103 to be measured, upon measuring the respective echo signals in one block, from among the sequence by the hybrid radial method of the present embodiment. Explanation on the other axes will be omitted since they are the same as FIG. 4. While measurement of the echo signal group is executed by rotating each block centering on approximately one point in the K-space in the hybrid radial method, FIG. 11(a) shows an example of the application pattern of the phase encode gradient magnetic field pulse corresponding to the block before rotation. Actually, sequencer 4 measures the echo signal group for each block by controlling the output amount of each gradient magnetic field in accordance with the rotation angle of each block.

Figure 11:
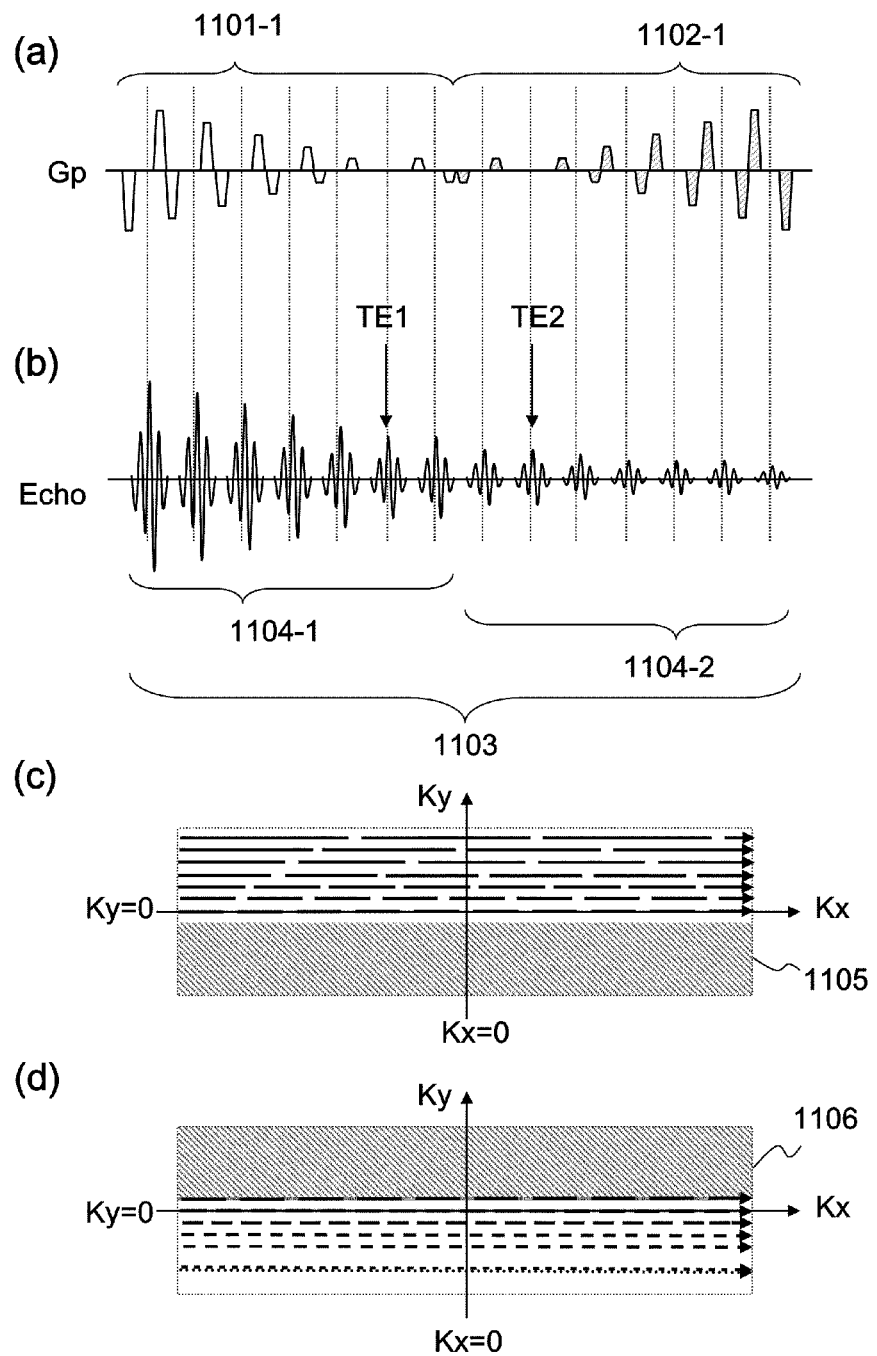
FIG. 11 is for explaining the outline on the division of an echo signal group in the third embodiment of the present invention.
Figure 1:
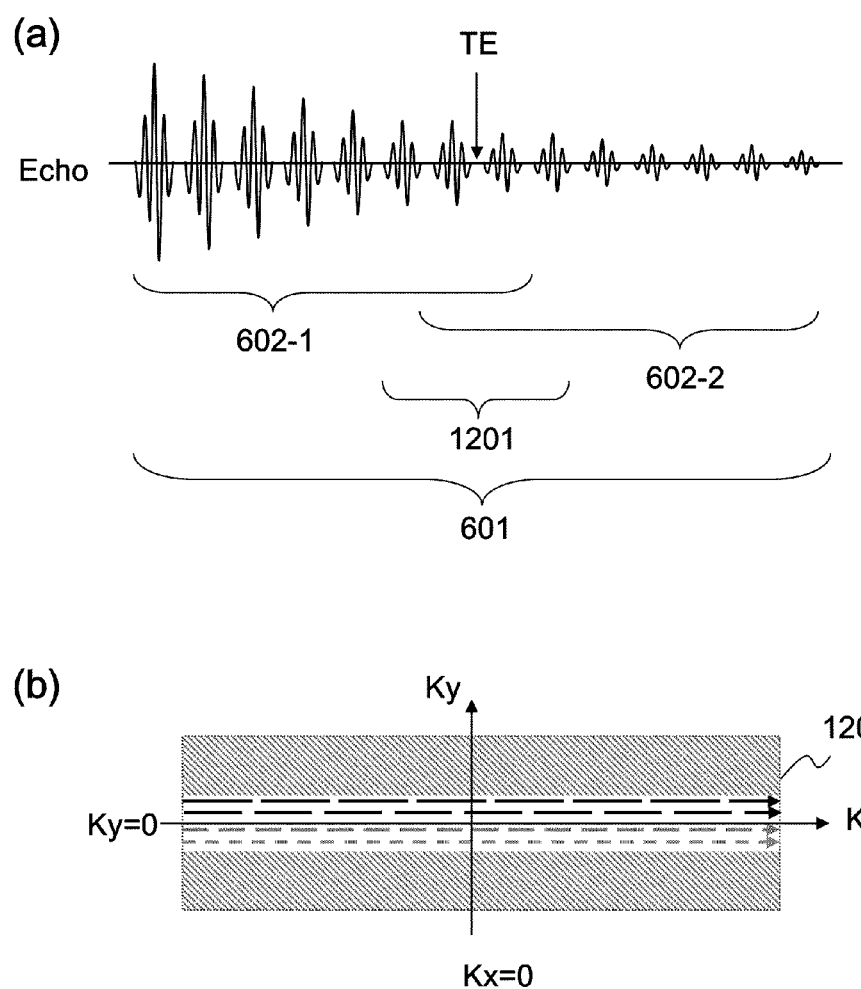

As shown in FIG. 11(*a*), phase encode gradient magnetic field pulse (Gp) has phase encode pulse group 1101-1 for measuring first partial echo signal group 1104-1 and phase encode pulse group 1102-1 for measuring second partial echo signal group 1104-2. Then echo times TE1 and TE2 are respectively set for each of the partial echo signal group, and sequencer 4 controls application of phase encode gradient magnetic field pulse (Gp) to make phase encode zero at the time of measuring the echo signal of echo times TE1 and TE2. As a result, a part of echo signals corresponding to the low-spatial frequency region for each block are measured twice. In other words, the echo signal is measured, before and after the time that phase encode amount is zero for each partial echo signal group. In the example of FIG. 11, the echo signal corresponding to Ky=−1,0,+1 is measured twice respectively.

First, measurement of first partial echo signal group 1104-1 will be described. In order to reconstruct an image using first partial echo signal group, the K-space in which the data of first partial echo signal group is placed needs to have more than a minimum amount of echo data necessary for image reconstruction. Given this factor, the present embodiment presents the case that one or more echo signals are measured after measurement of the echo signal at echo time TE1. Therefore, the echo signal is measured while the polar character of the phase encode gradient magnetic field pulse is inversed, even after application amount of the phase encode gradient magnetic field pulse becomes zero at echo time TE1. In other words, sequencer 4 decreases application amount of the phase encode gradient magnetic field pulse for each echo signal so as to measure the echo signals in order from the high-spatial frequency region side of one direction in the K-space toward the origin side, and makes application amount of the phase encode gradient magnetic field pulse zero at echo time TE1. After that, sequencer 4 measures the respective echo signals by inverting polar characters of the phase encode gradient magnetic field pulse and increasing application amount of the phase encode gradient magnetic field pulse for each echo signal so as to measure one or more echo signals in order from the origin side in the K-space toward the high-spatial frequency region side on the other side.

FIG. 11(*c*) shows the state of one block data (first block data) from among the K-space data acquired by placing the data of the first partial echo signal group which is measured as described above in the K-space. This block data 1105 is similar to block data 603 in FIG. 6(*c*) (while the numbers of echo signals to be measured are different between FIG. 11 and FIG. 6 for the sake of convenience, there is no essential difference in the content of K-space data and each block data between FIG. 6 and FIG. 11).

Next, measurement of second partial echo signal group 1104-2 will be described. In order to reconstruct an image using the second partial echo signal group, the k-space in which the data of the second partial echo signal is placed needs to have more than the minimum amount of echo data necessary for image reconstruction as in the first partial echo signal group. Given this factor, the present embodiment presents the case that one or more echo signals are measured before measurement of the echo signal at echo time TE2. Therefore, the echo signal is measured even before application amount of the phase encode gradient magnetic field pulse becomes zero at echo time TE2. In other words, sequencer 4 decreases application amount of the phase encode gradient magnetic field pulse so as to measure one or more echo signals in order from the low-spatial frequency region side of one direction in the K-space toward the direction of the origin, and makes application amount of the phase encode gradient magnetic field pulse zero at echo time TE2. After that, sequencer 4 measures the respective echo signals by inverting polar characters of the phase encode gradient magnetic field pulse and increasing application amount of the phase encode gradient magnetic field pulse for each echo signal so as to measure echo signals in order from the origin side in the K-space toward the high-spatial frequency region side on the other side.

FIG. 11(*d*) shows the state of one block data (second block data) from among the K-space data acquired by placing the data of the second partial echo signal group which is measured as described above in the K-space. This block data 1106 is similar to block data 604 n FIG. 6(*d*).

Figure 6:
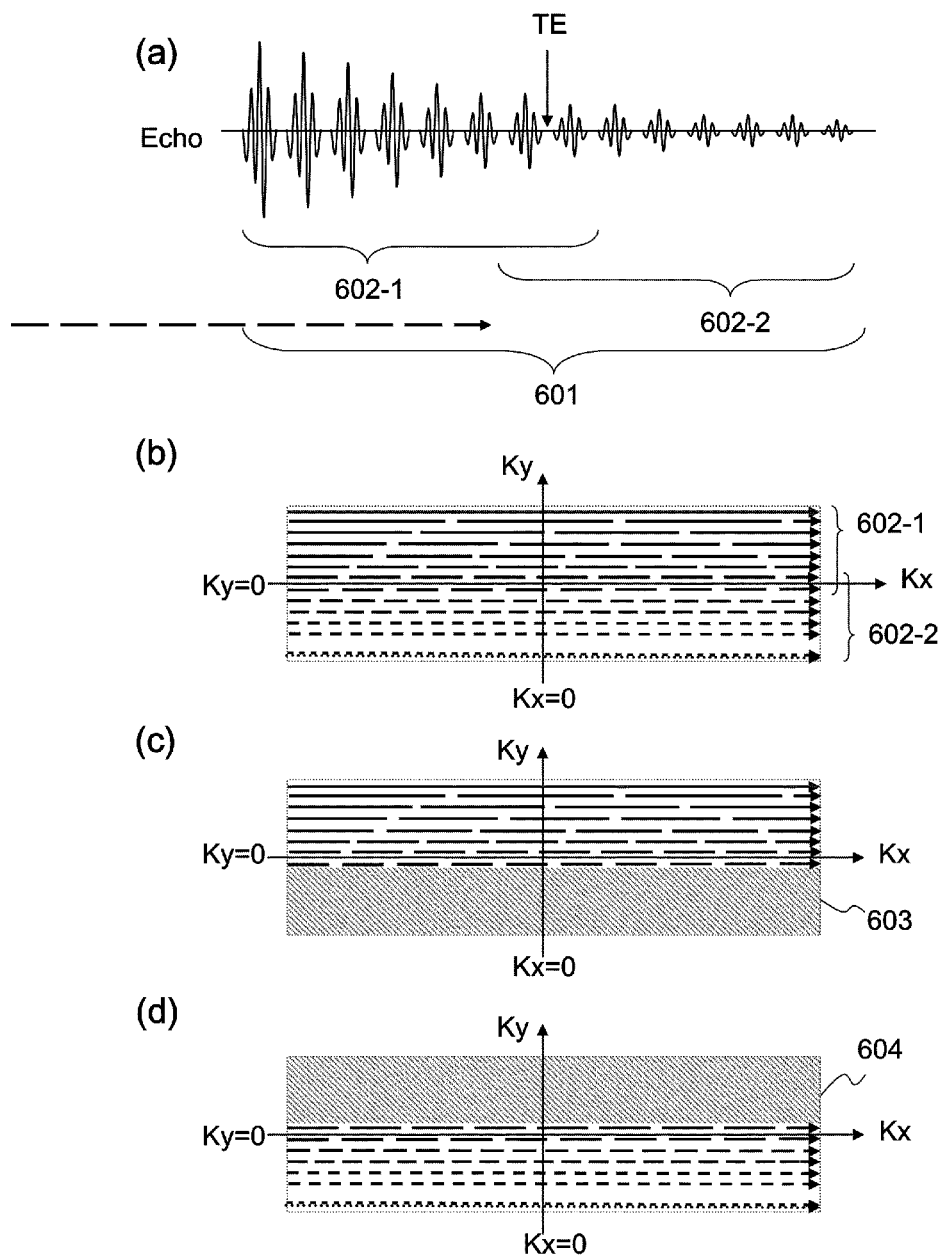
FIG. 6 is for explaining the outline on the division of an echo signal group in the first embodiment of the present invention.

Since the same echo data are not overlapped between such created first block data 1105 and second block data 1106, contrast of the two images constructed using the K-space data formed by the block data having such different characteristics are even further differentiated from the case of FIG. 6.

While FIG. 11 shows the case that one extra echo signal is measured from echo time TE in measurement of the respective partial echo signal groups (i.e. one extra echo signal is measured on the negative side in the Ky-direction in block data 1105 and one extra echo signal is measured on the positive side in the Ky-direction in block data 1106 respectively), extra echo signals need not necessarily be measured. Also, the number of extra echo signals to be measured can be set as more than one. Further, the number of extra echo signals to be measured can be differentiated among a plurality of partial echo signal groups.

The advantage in measuring extra echo signals is that the non-measured region (the shaded regions in FIGS. 11(*c*) and (*d*)) is decreased in each block whereby decreasing image deterioration due to lack of data and that accuracy of the phase map to be used for phase correction process to improve image quality is improved upon combination process such as the half estimation process to be described later.

Also, the present embodiment can be combined with the second embodiment. That is, in the present embodiment, the respective echo signal groups are to be measured by making the number of the first echo signal groups less than the number of the second partial echo signal groups. In this case, as in the case of FIG. 11, similar control as the above-described present embodiment is executed by setting two echo times TE1 and TE2.

As mentioned above, in accordance of the MRI apparatus and multi-contrast image acquisition method of the present embodiment, in measurement of the echo signal groups of each block, a part of the echo signals corresponding to the low-spatial frequency region is measured a plurality of times in a plurality of different echo times, and such measured echo signals are distributed to different partial echo signal groups respectively. In this manner, the echo signal group of the block can be divided so as not to overlap between the echo signals, and contrast difference between images can be further enhanced by creating block data respectively from the divided respective partial echo signal groups which further enhances the first effect described in the first embodiment.

Further, the body-motion correction process of the hybrid radial method can also be applied to the K-space data acquired in the present embodiment. While the extra echo data is measured near the center of the K-space (Ky=0) in the present embodiment, since an image of the low-spatial resolution can be obtained by selectively using the measured extra echo data, body-motion correction can be executed based on such obtained image. The body-motion correction can also be executed by averaging the measured extra echo data for each Ky and constructing the image of the low-spatial resolution.

Fourth Embodiment

Next, the fourth embodiment of the MRI apparatus and multi-contrast image acquisition method related to the present invention will be described. While the first embodiment divided the echo signal group in the measured block into two partial echo signal groups, the present embodiment divides the echo signal group in the measured block into three or more partial echo signal groups and constructs images having different contrasts from the respective partial echo signal groups.

The differences from the first embodiment are that the number of divisions of echo signal groups are more than three, the method of the division thereof and the processing flow after division. All but the above-mentioned differences are the same as the first embodiment. Only the differences from the first embodiment will be described below based on the example that divides the echo signal group into three shown in FIG. 12, and the duplicative description on the same part will be omitted.

FIG. 12(a) shows an example that the echo signal group in a measured block is divided into three partial echo signal groups by overlapping one or more echo signals of the echo signal group. In this example, the process is the same as the example which divides the echo signal group into two partial echo signal groups in the first embodiment, up to the step for creating two block data 603 and 604 using two partial echo signal groups 602-1 and 602-2 each having 8 echo signals shown in FIG. 6. The present embodiment further creates a third partial echo signal group 1201 using four echo signals in the vicinity of echo time TE. FIG. 12(b) is an example of block data 1202 acquired by placing in the K-space the echo data of third partial echo signal group 1201 which is the signal specific to the present embodiment. Since the echo time and the range thereof when block data 1202 is measured is different from block data 603 and 604 in FIG. 6(b) and (c), the images constructed from these 3 block data have different image contrasts respectively.

While the example shown in FIG. 12 divided the echo signal groups into three, the number of divisions of the echo signals may be four or more, and the measured plural echo signals can be combined as desired to set a preferable number of divisions.

In the processing flow in the present embodiment from the division of the echo signal group to reconstruction of images having different contrasts, the echo signals of the block measured as described above is divided into three partial echo signal groups in step 803 of the processing flow shown in FIG. 8. The processing flow also newly comprises the processing branch for image 3 other than processing branches 804~808 and 805~809 for images 1 and 2. The respective processing steps of the processing branch for image 3 are the same as the respective processing steps of the processing branches for images 1 and 2. However, regarding the processing results, the block data for image 3 is equivalent to block data for images 1 and 2, K-space data for image 3 is equivalent to the K-space data for images 1 and 2, and image 3 is equivalent to images 1 and 2.

As described above, in accordance with the MRI apparatus and multi-contrast image acquisition method of the present embodiment, it is possible to construct even more images having different contrasts in addition to the effect described in the first embodiment, since the echo signal group is divided into three or more partial echo signal groups by freely combining with a plurality of measured echo signals and images are reconstructed using the divided partial echo signals groups respectively.

Fifth Embodiment

Next, the fifth embodiment of the MRI apparatus and multi-contrast image acquisition method related to the present invention will be described.

While the first embodiment does not measure the data of the unmeasured echo signals in the block corresponding to the partial echo signal group, the present embodiment acquires the data of the unmeasured echo signal in the block corresponding to one or more partial echo signal groups using the half estimation process. All but this point is the same as the first embodiment. Only the difference from the first embodiment in the present embodiment will be described based on FIG. 13, and the duplicative description on the same parts will be omitted.

Figure 13:
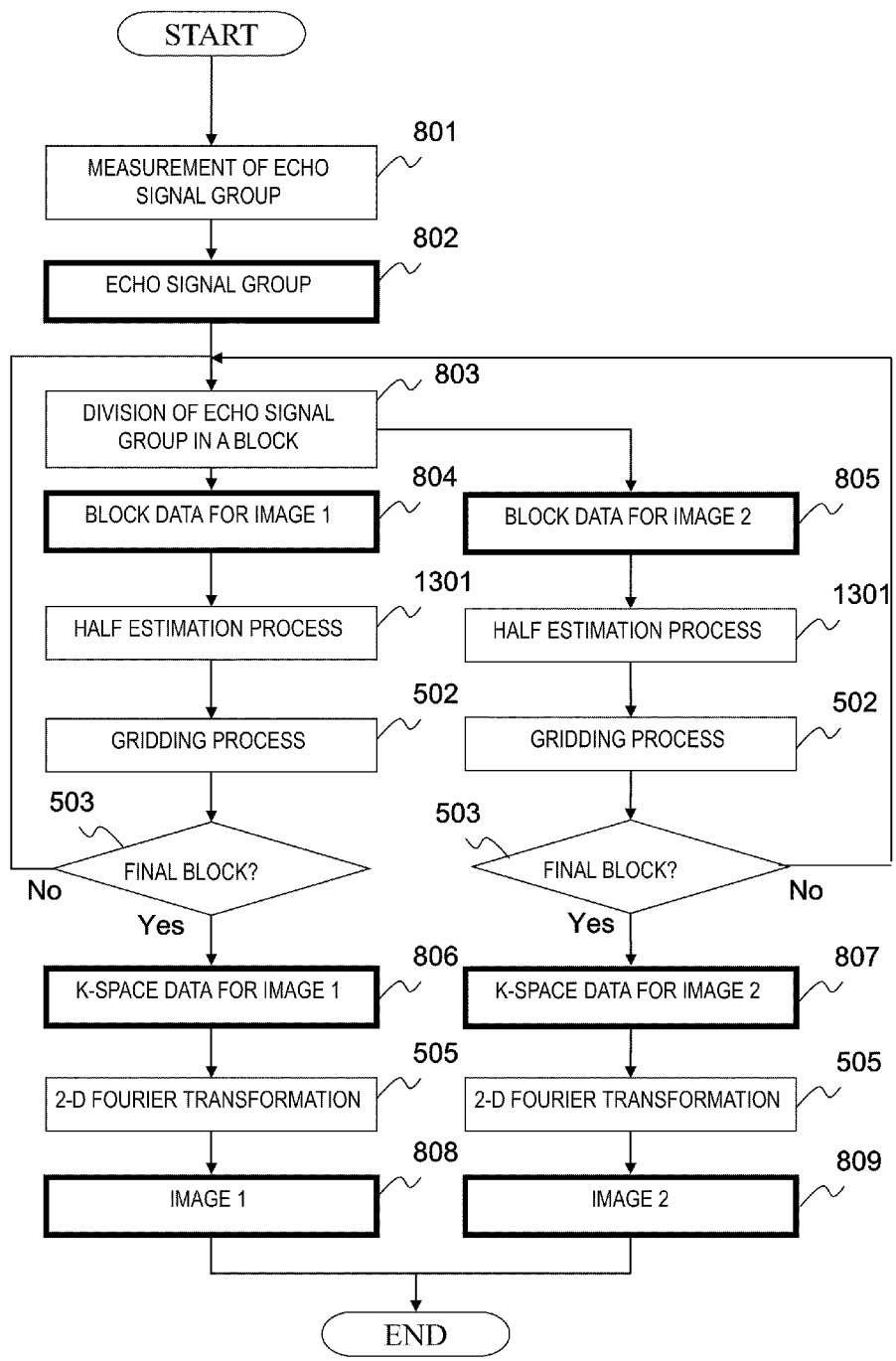
FIG. 13 is a processing flowchart of the fifth embodiment in the present invention.
Figure 1:
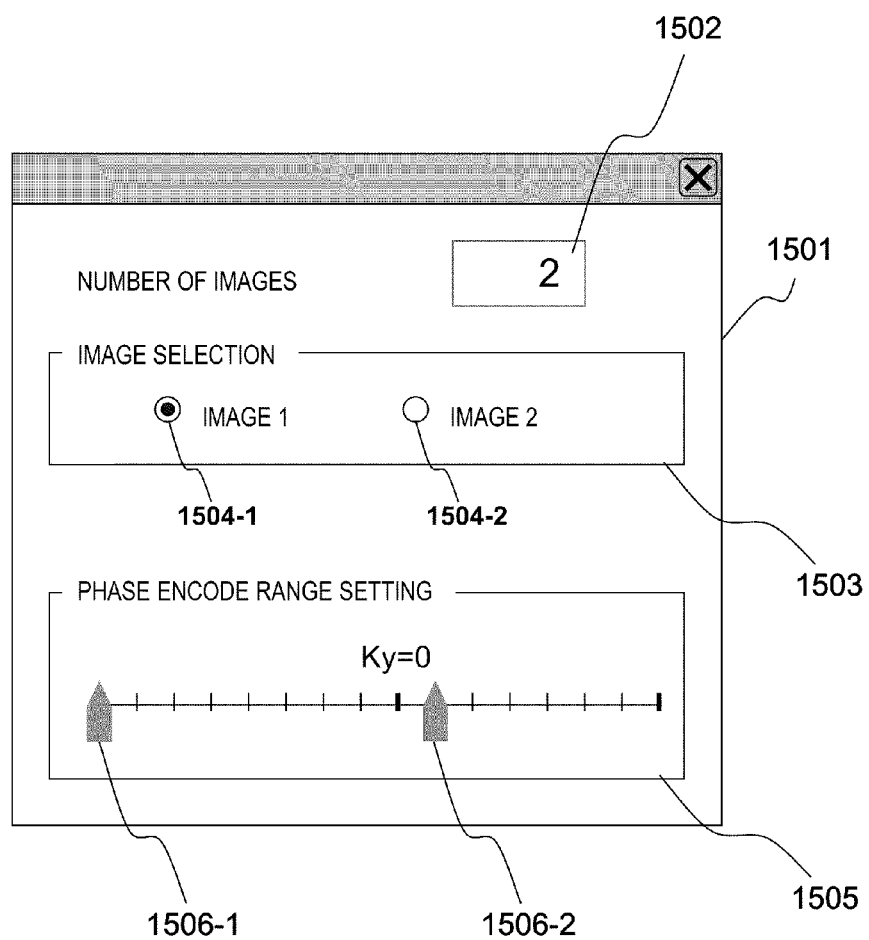

FIG. 13 is the flowchart showing the processing flow of the present embodiment. The difference from the processing flow of the first embodiment shown in FIG. 8 is that there is step 1301 for executing the half estimation process (for example, Patent Document 3) with respect to the respective block data 804 and 805 for the respective images that are divided in the echo signal group of the block in step 803.

In step 1301, the unmeasured echo data in the block corresponding to the partial echo signal group is replaced by the half estimation process. CPU 8 acquires and replaces the unmeasured echo data indicated by the shaded parts in FIGS. 6(c) and (d) in data 804 and 805 for one block portion for the respective images which are divided in step 803, using the half estimation process. The gridding process is performed on the estimated data and the block data which are actually acquired in step 502, and the processed data are placed in the K-space so as to be K-space data 806 and 807 for images.

Then CPU 8 executes the replacement process on the unmeasured echo data for each block using the above-mentioned half estimation process, and determines whether the process of the final block data is completed or not in step 503. If it is determined that the process is completed in the final block, CPU 8 obtains images 1 and 2 by executing 2-dimensional Fourier process 505 on each K-space data 806 and 807 respectively.

Since all but step 1301 are the same as the process in each step in the processing flow of the previously described first embodiment shown in FIG. 8, the description thereof will be omitted. The half estimation method needs to be executed on one or more blocks, and the process described in the first embodiment may be applied to the blocks that are not executed with the half estimation method. Though the signal-to-noise ratio of the image is usually lowered when the half estimation method is applied, in the hybrid radial method, the signal-to-noise ratio of the image improves due to summation effect even when the half estimation method is executed for each block since the echo data near the central region in the K-space is measured by being overlapped. As a result, the hybrid radial method is capable of compensating the lowering of signal-to-noise ratio of the images which is attributed to the half estimate method.

As described above, in accordance with the MRI apparatus and multi-contrast image acquisition method of the present embodiment, it is possible to improve spatial resolution of the final image without increasing the number of measured echo signal, i.e. without extending the imaging time, by replacing the unmeasured echo data of the block corresponding to one or more partial echo signal groups using the half estimation process.

Sixth Embodiment

Next, the sixth embodiment of the MRI apparatus and multi-contrast image acquisition method of the present embodiment will be described. While images are reconstructed using the echo data of the block corresponding to the partial echo signal group as they are in the first embodiment, the present embodiment further improves image contrast by applying the spatial frequency filter for weighting a specific region data of the K-space with respect to the block data corresponding to the partial echo signal group. All but this point is the same as the first embodiment.

Only the difference from the first embodiment will be described below based on FIG. 14, and duplicative description on the same part will be omitted.

FIG. 14 shows an example of the spatial frequency filter. FIG. 14(a) is an example of the filter corresponding to one block region in the K-space. The example in FIG. 14(a) shows the filter function wherein the amplitude varies linearly with respect to phase encode direction (Ky) and is constant with respect to frequency encode direction (Kx) in the block. FIG. 14(b) shows the signal variation in A-A' line of the filter shown in FIG. 14(a). When the number of echo data to be measured in the block is set as "N" (echo number is $1 \leq n \leq N$), filter function f(n) is expressed in the expression below (a=1 and b=0.5 in the example of FIG. 14(b)).

$$f(n)=a/N\times(n-N/2)+b \quad \text{(expression 1)}$$

In this filter function, the echo data of the position that Ky>0 is emphasized from among the measured echo data. Also, the echo data of the position that Ky<0 is emphasized by making a=−1.

FIG. 14(c) is another example of the spatial frequency filter. The example in FIG. 14(c) shows the function wherein the selective frequency region of the filter is narrow in the central portion in the block region (the part where |Kx| is small) and the selective frequency region gets wider as |Kx| gets larger. FIG. 14(d) shows the signal variation in B-B' line of the filter shown in FIG. 14(c).

While this filter is basically the function having signal intensity variation of quadratic function which is:

$$f(x)=c\times(x-X/2)^2+d\times(x-X/2)+e \quad \text{(expression 2)}$$

(here, $1 \leq x \leq X$), in FIG. 14(c), the width of the filter varies in proportion to position Kx.

The width of filter function can be defined by:

$$B(Kx)=N/(KX/2)\times|Kx-KX/2| \quad \text{(expression 3)},$$

and using this B(Kx) and the coefficient corresponding to position Kx in the Ky-direction:

$$a(Kx)=-1.0/(B(Kx)/2)^2$$

$$b(Kx)=0.0$$

$$c(Kx)=1.0 \quad \text{(expression 4)},$$

filter f (Kx, n) is expressed by:

$$f(Kx,n)=c(Kx)\times(n-N/2)^2+d(Kx)\times(n-N/2)+3(Kx) \text{ if } |n-N/2|\leq B(Kx) f(Kx,n)=0.0 \text{ otherwise} \quad \text{(expression 5)}.$$

The above-mentioned filter can be applied to the dissymmetric block data described in the second embodiment. In this case, the filter should not be calculated based on the width of actually acquired block data, but the filter function should be calculated by extending the width of block data to be the size which is symmetric centering on Ky=0.

The shape and variable to be set for the filter function are not limited to the values described in the present embodiment, and the filter shape can be varied in accordance with the spatial frequency region in the K-space desired to be emphasized.

As mentioned above, in accordance with the MRI apparatus and multi-contrast image acquisition method of the present embodiment, it is possible to further improve contrast in images by applying the spatial frequency filter for emphasizing data of a specific region in the K-space to the block data corresponding to the partial echo signal group whereby enhancing the first effect described in the first embodiment.

In the above-described embodiments 1~6, it is necessary to set the kind of target image upon setting echo time (TE) in advance. Since it is necessary in general to set repetition time (TR) also for T1 enhanced image, echo time (TE) is adjusted to be suited for imaging other contrast images. On the other hand, it is easy to execute multi-contrast imaging for proton-enhanced images and T2 enhanced images, since there is no problem to set TR at the same level. On this occasion, images having preferable contrast can be obtained by setting echo time (TE) for measuring the echo signal that is Ky=0 about 15 ms in each block to use as a rough standard for the division of the echo signal groups so as to gain optimal contrast of the proton enhanced image.

Seventh Embodiment

Next, the seventh embodiment of the MRI apparatus and multi-contrast image acquisition method will be described. While predetermined values are set for the parameters related to the present invention such as the number of divisions of the echo signal groups in blocks in the first embodiment, the present embodiment enables an operator to change the parameters related to the present invention to desired values in order to obtain images having desired contrasts. All but this point is the same as the first embodiment. Regarding the present embodiment, only the difference from the first embodiment will be described below based on FIG. 15, and the explanation on the same part will be omitted.

FIG. 15 shows the parameter selection window which is an example of user interface (UI) in the present embodiment. This window 1501 has number of images inputting unit 1502, image selecting unit 1503 and phase encode range setting unit 1505.

Number of images inputting unit 1502 is for inputting the number of images desired to be reconstructed. The operator inputs the number of images to be reconstructed to number of images inputting unit 1502 via a device such as a keyboard. FIG. 15 shows an example that "2" is inputted as the number of images to be reconstructed.

Image selecting unit 1503 is for selecting an image to which contrast is set. In accordance with the inputted/set number of images in number of images inputting unit 1502, the names and selective buttons of {+IDENTIFICATION NUMBER} are displayed integrally as alternatives of images. The operator selects a desired image using a device such as a mouse. FIG. 15 shows an example that, since "2" is set as the number of images in number of images inputting unit 1502, {IMAGE 1}, the selective button 1504-1, {IMAGE 2} and the selective button 1504-2 are displayed as alternatives and {IMAGE 1} is selected.

Phase encode range setting unit 1505 is for setting the phase encode range of the echo signal to be used for image reconstruction with respect to the image selected in image selecting unit 1503. This phase encode range setting unit 1505 is provided with slice bar 1506-1 for setting the upper limit and slide bar 1506-2 for setting the lower limit regarding the position according to the phase encode number of the K-space. The operator selects the phase encode range of the echo signal to be used for image reconstruction by changing the position of these slice bars as desired via a device such as a mouse.

The above-mentioned respective parameters related to the present embodiment may be set using parameter selecting window 1501 prior to imaging. Alternatively, in the case that a plurality of images having different contrasts are to be reconstructed by post-processing based on the K-space data acquired by the imaging using the sequence of the hybrid radial method, the respective parameters may be set via parameter selecting window 1501. In the case that a plurality of images having different contrasts is to be reconstructed by post-processing, it is preferable that the operator changes at least one of the parameters and at the same time the image to which the changed parameter is reflected is displayed on an image displayer. Especially in the latter case, the operator can set the phase encode range to make the contrast to be optimal while observing the image.

As described above, in accordance with the MRI apparatus and multi-contrast image acquisition method of the present embodiment, an operator can obtain images having a desired contrast by setting one or more parameters from among the number of images, selection of an image and the phase encode range of the echo signal to be used for image reconstruction variable either before or after the imaging and obtaining the image to which the change is reflected.

The preferable embodiments of the MRI apparatus and multi-contrast image acquisition method according to the present invention have been described. However, the present invention is not limited to these embodiments, and various kinds of alterations or modifications can be made within the scope of the present invention.

For example, while each embodiment described the FSE sequence from among multi-echo sequences, the present invention can be applied also to the EPI sequence.

Also, while the case has been described that the block is rotated centering on approximately one point in the 2-dimensional K-space having Gf (Kx)–Gp (ky) axes as an embodiment of the radial sampling method and the hybrid radial method, Gf-axis and Gp-axis can be corresponded to the desired axes of X, Y and Z in the imaging space whereby making it possible to execute oblique imaging or off-centered imaging. Further, rotation in the 3-dimensional sphere can also be executed.

Also, while the number of blocks is illustrated in the diagrams using a low number as an example of the radial sampling method or hybrid radial method, the number of blocks and echoes in the block can be set as desired to execute the same processes described in the respective embodiments.

The invention claimed is:

1. A magnetic resonance imaging apparatus comprising:
a measurement controller configured to control measurement of echo signals generated from an object to be examined using an RF pulse and gradient magnetic field to be applied to the object; and
arithmetic processor configured to execute calculations including reconstruction of an image of the object using the echo signals,
wherein:
the measurement controller repeats the measurement of the echo signals to obtain echo signal groups corresponding to blocks having a plurality of parallel trajectories on a K-space, while changing rotation angle of a block centering on approximately one point in the K-space; and
the arithmetic processor executes image reconstruction of the object using the echo signal group for each block, characterized in that the arithmetic processor divides the echo signal group of one or more blocks into a plurality of partial echo signal groups respectively, and reconstructs a plurality of images respectively having different image contrasts using the respective divided partial echo signal groups.

2. The magnetic resonance imaging apparatus according to claim 1, wherein the arithmetic processor executes division of an echo signal group of the block by overlapping one or more echo signals of the echo signal group in the block with two or more partial echo signal groups from among the plurality of partial echo signal groups generated by dividing the echo signal group of the block.

3. The magnetic resonance imaging apparatus according to claim 2, wherein the arithmetic processor selects the echo signal corresponding to the low-spatial frequency region in the K-space as the echo signal to be overlapped.

4. The magnetic resonance imaging apparatus according to claim 1, wherein the arithmetic processor divides echo signal groups in the block into the partial echo signal groups wherein the echo signals having a short elapsed time from irradiation of the RF pulse are collected and the partial echo signal group wherein the echo signals having a long elapsed time.

5. The magnetic resonance imaging apparatus according to claim 1, wherein the arithmetic processor execute division of echo signal groups in the block by differentiating the number of echo signals to be collected as the respective partial echo signal groups.

6. The magnetic resonance imaging apparatus according to claim 4, wherein the arithmetic processor executes division of echo signal groups in the block so as to make the number of echo signals to be collected as the partial echo signal group formed by the echo signals having a short elapsed time less than the number of echo signals to be collected as the partial echo signal group formed by the echo signals having a long elapsed time.

7. The magnetic resonance imaging apparatus according to claim 1, wherein the measurement controller measures the echo signal group of the block to make distribution of echo signals in the block to be dissymmetric about the rotation center of the block.

8. The magnetic resonance imaging apparatus according to claim 1, wherein the arithmetic processor divides the echo signal groups of the block by not overlapping the same echo signals with a plurality of echo signal groups.

9. The magnetic resonance imaging apparatus according to claim 8, wherein the measurement controller measures the echo signal group in the block by controlling the gradient magnetic field so that the respective plurality of partial echo signal groups include the echo signals measured when the phase encode amount is zero at the respective different echo times (TE).

10. The magnetic resonance imaging apparatus according to claim 1, wherein the arithmetic processor causes one or more echo signals among the echo signal group of the block to overlap with each other, divides the echo signal group of the block into three or more partial echo signal groups, and reconstructs images having respectively different contrasts using the echo signal of the respective partial echo signal groups.

11. The magnetic resonance imaging apparatus according to claim 1, wherein the arithmetic processor acquires data of the unmeasured echo signal in the block which is assumed corresponding to the partial echo signal group, using the half estimation process.

12. The magnetic resonance imaging apparatus according to claim 1, wherein the arithmetic processor applies the spatial frequency filter for the weighting on the data of the partial echo signal groups.

13. The magnetic resonance imaging apparatus according to claim 1, further comprising:
- a setting input unit configured to set parameters including the number of images equivalent to the number of the partial echo signal groups, the phase encode range of the echo signals to be collected as the partial echo signal group and selection of the image in which the phase encode range is to be set, wherein:
- the measurement controller measures the echo signal group of the block by corresponding to the parameters set by the setting input unit; and
- the arithmetic processor divides the echo signal group in the block by corresponding to the parameters set by the setting input unit.

14. A multi-contrast image acquisition method, comprising:
- a measurement step, performed by a magnetic resonance imaging apparatus, to repeat measurement of an echo signal group from an object to be examined corresponding to a block formed by having a plurality of parallel trajectories on a K-space while varying rotation angle of the block centering on approximately one point in the K-space; and
- an arithmetic processing step, performed by the magnetic resonance imaging apparatus, to execute calculation including image reconstruction of the object using the echo signal group for each of the block,
- wherein the arithmetic processing step performed by the magnetic resonance imaging apparatus divides the echo signal group of one or more blocks into a plurality of partial echo signal groups and reconstructs a plurality of images having different image contrasts respectively using the divided respective partial echo signal groups.

15. The multi-contrast image acquisition method according to claim 14, further comprising:
- a parameter setting step configured to set parameters for dividing the echo signal group of the block into a plurality of partial echo signal groups, wherein:
- the measurement controller measures the echo signal group of the block corresponding to the parameters set by the parameter setting step; and
- the arithmetic processor divides the echo signal group in the block corresponding to the parameters set by the parameter setting step.

* * * * *